United States Patent
Dinger et al.

(10) Patent No.: US 9,442,383 B2
(45) Date of Patent: Sep. 13, 2016

(54) EUV-MIRROR ARRANGEMENT, OPTICAL SYSTEM WITH EUV-MIRROR ARRANGEMENT AND ASSOCIATED OPERATING METHOD

(71) Applicant: CARL ZEISS SMT GMBH, Oberkochen (DE)

(72) Inventors: Udo Dinger, Oberkochen (DE); Frederik Bijkerk, Bosch en Duin (NL); Muharrem Bayraktar, Enschede (NL); Oliver Dier, Lauchheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 354 days.

(21) Appl. No.: 14/034,069

(22) Filed: Sep. 23, 2013

(65) Prior Publication Data

US 2014/0285783 A1    Sep. 25, 2014

Related U.S. Application Data

(63) Continuation of application No. PCT/EP2012/055013, filed on Mar. 21, 2012.

(60) Provisional application No. 61/466,631, filed on Mar. 23, 2011, provisional application No. 61/494,718, filed on Jun. 8, 2011.

(30) Foreign Application Priority Data

Mar. 23, 2011  (DE) .................. 10 2011 005 940
Jun. 8, 2011    (DE) .................. 10 2011 077 234

(51) Int. Cl.
*G03B 27/52*     (2006.01)
*G03F 7/20*      (2006.01)
(Continued)

(52) U.S. Cl.
CPC .......... *G03F 7/70166* (2013.01); *B82Y 10/00* (2013.01); *G02B 5/0891* (2013.01); *G03F 7/702* (2013.01); *G03F 7/70075* (2013.01); *G21K 1/062* (2013.01); *G21K 2201/067* (2013.01)

(58) Field of Classification Search
CPC ............... G03F 7/702; G03F 7/70075; G03F 7/70116; G03F 7/70316; G03F 7/70191; G03F 1/24; G03F 7/70058; G03F 1/48; G03F 7/70141; G03F 7/70258; G03F 7/70216; G03F 7/70575; G02B 5/0891; G02B 26/0833; G02B 5/09; G02B 26/0816; G02B 19/0023; G02B 19/00

See application file for complete search history.

(56) References Cited

U.S. PATENT DOCUMENTS 6,864,958 B2    3/2005    Bleeker et al.
6,992,754 B2    1/2006    Bleeker et al.
(Continued)

FOREIGN PATENT DOCUMENTS

CN    101278376 A    10/2008
CN    101840159 A    9/2010
(Continued)

OTHER PUBLICATIONS

Office Action in corresponding European Application No. 12712999.7, dated Aug. 19, 2015.
(Continued)

*Primary Examiner* — Mesfin T Asfaw
(74) *Attorney, Agent, or Firm* — Edell, Shapiro & Finnan LLC

(57) ABSTRACT

An EUV mirror arrangement (100) has a multiplicity of mirror elements (110, 111, 112) which are arranged alongside one another and jointly form a mirror surface of the mirror arrangement. Each mirror element has a substrate (120) and a multilayer arrangement (130) applied on the substrate and having a reflective effect with respect to radiation from the extreme ultraviolet range (EUV), said multilayer arrangement comprising a multiplicity of layer pairs (135) having alternate layers composed of a high refractive index layer material and a low refractive index layer material. The multilayer arrangement has an active layer (140) arranged between a radiation entrance surface and the substrate and consisting of a piezoelectrically active layer material, the layer thickness (z) of which active layer can be altered by the action of an electric field. For each active layer provision is made of an electrode arrangement for generating an electric field acting on the active layer.

25 Claims, 11 Drawing Sheets

(51) Int. Cl.
  *B82Y 10/00*  (2011.01)
  *G21K 1/06*  (2006.01)
  *G02B 5/08*  (2006.01)

(56) References Cited

U.S. PATENT DOCUMENTS

| | | |
|---|---|---|
| 7,545,585 B2 | 6/2009 | Wiener |
| 7,599,112 B2 | 10/2009 | Shiraishi |
| 7,771,898 B2 | 8/2010 | Masaki et al. |
| 7,948,675 B2 | 5/2011 | Shiraishi |
| 8,885,147 B2 | 11/2014 | Vervoordeldonk et al. |
| 2003/0063266 A1 | 4/2003 | Gilissen et al. |
| 2003/0081319 A1 | 5/2003 | Hsu |
| 2004/0051856 A1 | 3/2004 | Bleeker et al. |
| 2004/0120458 A1 | 6/2004 | Dierichs et al. |
| 2005/0117139 A1 | 6/2005 | Bleeker et al. |
| 2005/0237618 A1 | 10/2005 | Yamamoto et al. |
| 2005/0271957 A1 | 12/2005 | Miyachi et al. |
| 2006/0018045 A1 | 1/2006 | Moeller et al. |
| 2008/0043321 A1* | 2/2008 | Bowering ............ G02B 5/0891 359/359 |
| 2008/0113281 A1 | 5/2008 | Maul et al. |
| 2008/0113870 A1* | 5/2008 | Lee ...................... H01L 39/248 505/470 |
| 2008/0143984 A1 | 6/2008 | Holderer et al. |
| 2008/0165925 A1 | 7/2008 | Singer et al. |
| 2009/0253055 A1 | 10/2009 | Hayashi et al. |
| 2010/0201962 A1 | 8/2010 | Juergens |
| 2010/0214548 A1 | 8/2010 | Vervoordeldonk et al. |

FOREIGN PATENT DOCUMENTS

| | | |
|---|---|---|
| DE | 102004051838 A1 | 5/2005 |
| DE | 60319635 T2 | 4/2009 |
| DE | 2009135576 A1 | 11/2009 |
| EP | 1349009 A2 | 10/2003 |
| EP | 1426821 A1 | 6/2004 |
| JP | H05100097 A | 4/1993 |
| JP | 2005308629 A | 11/2005 |
| TW | 201040670 A1 | 11/2010 |
| TW | 201104358 A1 | 2/2011 |
| WO | 2009100856 A1 | 8/2009 |
| WO | 2010049020 A1 | 5/2010 |

OTHER PUBLICATIONS

Office Action in related Taiwanese Application No. 101109813, dated Mar. 14, 2014, along with an English translation.
German Office Action dated Jan. 16, 2012, issued in German Patent Application No. 102011005940.7.
International Search Report dated Jul. 26, 2012, issued in International application No. PCT/EP2012/055013.
Office Action in corresponding Japanese Application No. 2014-5500375, dated Dec. 15, 2015, along with an English translation.
Office Action in corresponding Chinese Application No. 201280015247.X, dated Aug. 27, 2015, along with an English translation.
Search Report and Office Action in counterpart Taiwanese Application No. 104101922, dated May 5, 2016, along with English translation.

* cited by examiner

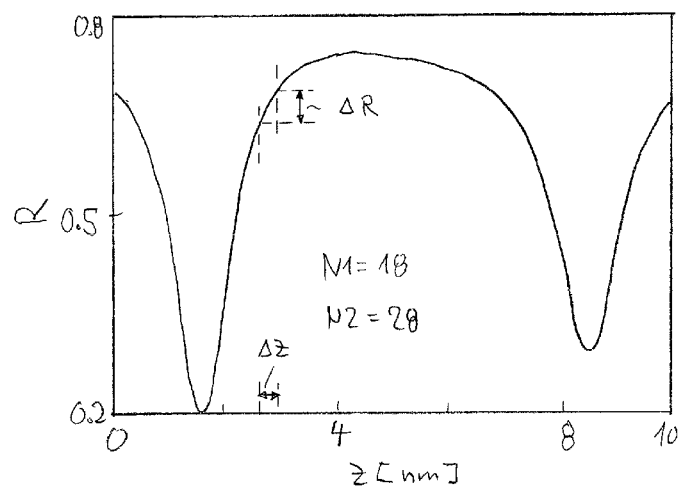
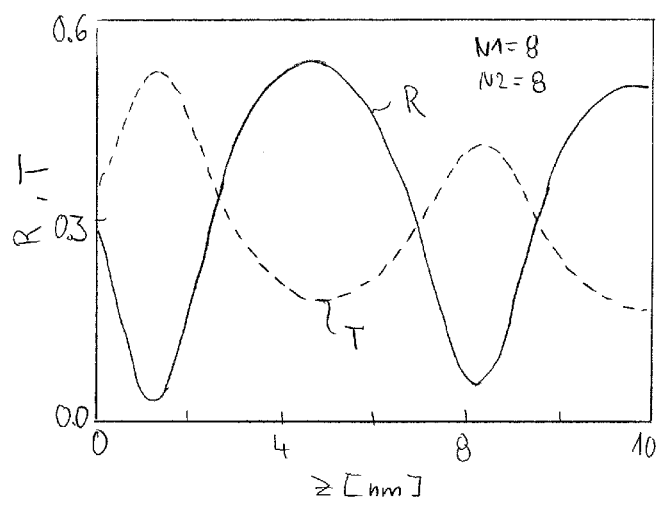

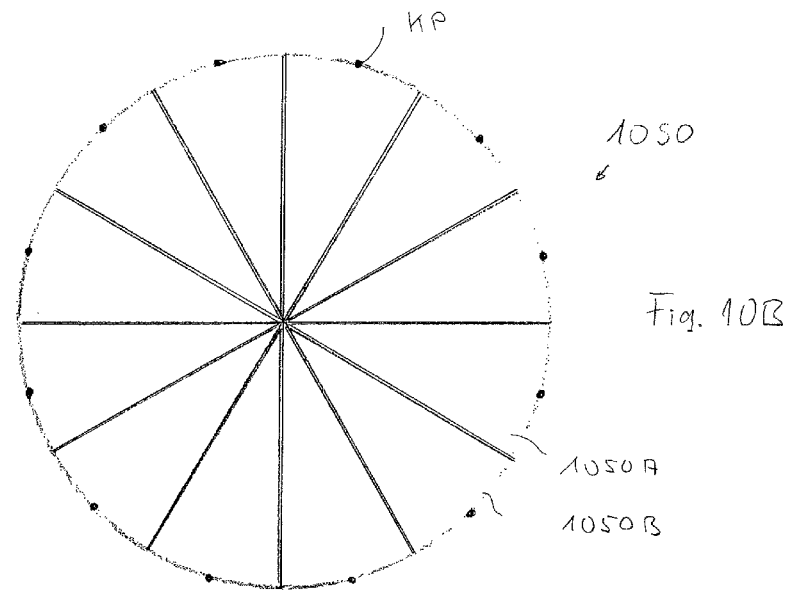
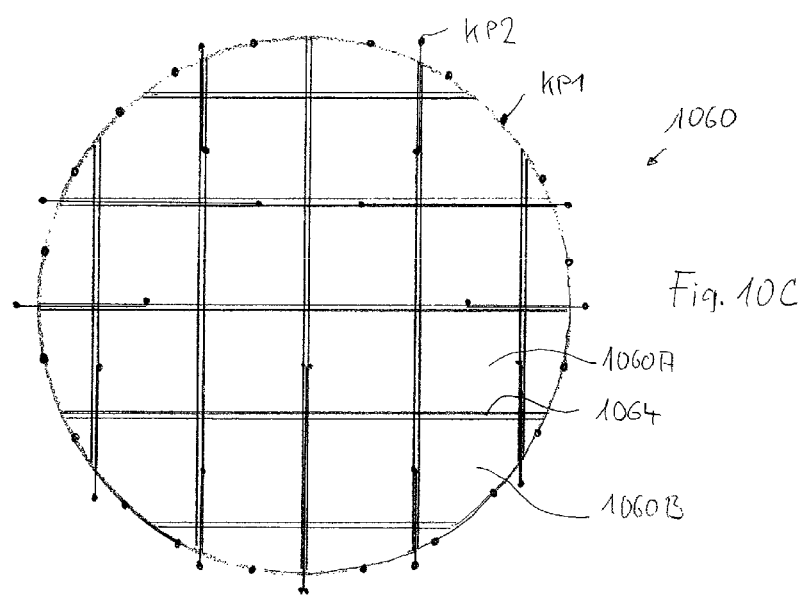

EUV-MIRROR ARRANGEMENT, OPTICAL SYSTEM WITH EUV-MIRROR ARRANGEMENT AND ASSOCIATED OPERATING METHOD

The present application is a Continuation of International Application No. PCT/EP2012/055013, filed on Mar. 21, 2012, which claims priority of German Patent Application No. 10 2011 005 940.7, filed on Mar. 23, 2011, U.S. Provisional Application No. 61/466,631, filed on Mar. 23, 2011, German Patent Application No. 10 2011 077 234.0, filed on Jun. 8, 2011, and U.S. Provisional Application No. 61/494,718, filed on Jun. 8, 2011. The disclosures of these five applications are hereby incorporated herein by reference in their respective entireties.

FIELD OF AND BACKGROUND OF THE INVENTION

The invention relates to an EUV mirror arrangement in accordance with the preamble of claim 1, to an optical system comprising an EUV mirror arrangement in accordance with the preamble of claim 16, and to a method for operating an optical system in accordance with the preamble of claim 21. One preferred field of application is EUV microlithography. Other fields of application are in EUV microscopy and EUV mask metrology.

Nowadays predominantly microlithographic projection exposure methods are used for producing semiconductor components and other finely structured components. In this case, use is made of masks (reticles) or other patterning devices which carry or form the pattern of a structure to be imaged, e.g. a line pattern of a layer of a semiconductor component. The pattern is positioned in a projection exposure apparatus between an illumination system and a projection lens in the region of the object surface of the projection lens and illuminated with an illumination radiation provided by the illumination system. The radiation altered by the pattern passes as projection radiation through the projection lens, which images the pattern onto the substrate to be exposed, which is coated with the radiation-sensitive layer.

The pattern is illuminated with the aid of an illumination system, which, from the radiation from a primary radiation source, forms an illumination radiation which is directed onto the pattern and which is characterized by specific illumination parameters and impinges on the pattern within an illumination field of defined form and size. Within the illumination field, a predetermined local intensity distribution should be present, which is normally intended to be as uniform as possible.

In general, depending on the type of structures to be imaged, different illumination modes (so-called illumination settings) are used, which can be characterized by different local intensity distributions of the illumination radiation in a pupil surface of the illumination system. It is thereby possible to predetermine in the illumination field a specific illumination angle distribution or a specific distribution of the impinging intensity in the angle space.

In order to be able to produce ever finer structures, various approaches are pursued. By way of example, the resolution capability of a projection lens can be increased by enlarging the image-side numerical aperture (NA) of the projection lens. Another approach consists in employing shorter wavelengths of the electromagnetic radiation.

If it is attempted to improve the resolution by increasing the numerical aperture, then problems can arise by virtue of the fact that as the numerical aperture increases, the depth of focus (DOF) that can be achieved decreases. This is disadvantageous because a depth of focus of the order of magnitude of at least 0.1 nm is desirable for example for reasons of the achievable flatness of the substrates to be structured and mechanical tolerances.

For this reason, inter alia, optical systems have been developed which operate with moderate numerical apertures and achieve the increase in the resolution capability substantially by means of the short wavelength of the used electromagnetic radiation from the extreme ultraviolet range (EUV), in particular having operating wavelengths in the range of between 5 nm and 30 nm. In the case of EUV lithography having operating wavelengths of around 13.5 nm, for example given image-side numerical apertures of NA=0.3 it is theoretically possible to achieve a resolution of the order of magnitude of 0.03 µm in conjunction with typical depths of focus of the order of magnitude of approximately 0.15 µm.

Radiation from the extreme ultraviolet range cannot be focused or guided with the aid of refractive optical elements, since the short wavelengths are absorbed by the known optical materials that are transparent at higher wavelengths. Therefore, mirror systems are used for EUV lithography. A mirror (EUV mirror) having a reflective effect with respect to radiation from the EUV range typically has a substrate, on which is applied a multilayer arrangement having a reflective effect with respect to radiation from the extreme ultraviolet range (EUV) and having a large number of layer pairs comprising alternately low refractive index and high refractive index layer material. Layer pairs for EUV mirrors are often constructed with the layer material combinations molybdenum/silicon (Mo/Si) or ruthenium/silicon (Ru/Si).

In order to ensure a best possible uniformity of the lithographic imaging, it is generally endeavoured to produce an intensity distribution that is as uniform as possible in the illumination field illuminated by the illumination system. Furthermore, it is normally endeavoured to approximate the local intensity distribution of the illumination rays that is desired for a specific exposure in the pupil surface of the illumination system as exactly as possible to the desired spatial intensity distribution or to minimize deviations from a desired spatial intensity distribution. These requirements not only have to be met by the lithographic optical system at the time of its delivery, but have to be maintained over the entire lifetime of the optical system without significant change. While in the former case possible deviations are substantially based on design residues and manufacturing faults, changes over the lifetime are often substantially caused by ageing phenomena.

In optical systems for lithography using ultraviolet light from the deep or very deep ultraviolet range (DUV or VUV), non-uniformities that possibly arise can generally be compensated for by driveable mechanical compensators (cf. e.g. US 2008/113281 A1 or U.S. Pat. No. 7,545,585 B2).

In optical systems for EUV microlithography, such compensators are significantly more difficult to realize, inter alia for geometrical reasons. By way of example, a freely accessible intermediate field plane which is optically conjugate with respect to the object plane of the projection lens and in which the field homogeneity can be corrected in a simple manner often does not exist. WO 2010/049020 A1 discloses possibilities for correcting the illumination intensity distribution and the illumination angle distribution in the illumination field of an EUV illumination system. Other correction devices are disclosed in US 2003/0063266 A1, EP 1 349 009 A2, US 2008/0165925 A1 or WO 2009/135576 A1.

OBJECTS AND SUMMARY OF THE INVENTION

A problem addressed by the invention is that of providing an EUV mirror arrangement and an optical system equipped therewith which can be used in a microlithography projection exposure apparatus, for example, in order to ensure, over the entire lifetime of the projection exposure apparatus, a high fidelity and stability of the illumination intensity in field and pupil with regard to a predetermined distribution and thus the lithographic imaging quality.

For solving this problem, the invention provides an EUV mirror arrangement comprising the features of claim 1. An optical system comprising an EUV mirror arrangement comprising the features of claim 16 and a method for operating such an optical system comprising the features of claim 21 are furthermore provided.

Advantageous developments are specified in the dependent claims. The wording of all the claims is incorporated by reference in the content of the description.

The EUV mirror arrangement has a multiplicity of mirror elements which are arranged alongside one another and jointly form a mirror surface of the mirror arrangement. In this case, the element mirror surface of a mirror element forms a fraction of the total mirror surface. Mirror elements can be arranged alongside one another for example in rows and columns in a manner substantially filling the surface area or completely filling the surface area or else mutually at a distance from one another. The mirror elements can be mirror elements that can be mounted separately from one another and, if appropriate, in a manner separated by interspaces on a carrier structure.

It is also possible for the mirror elements to have a common substrate and for the multilayer arrangement to have continuous layers over the entire useable region. In this case, the electrode arrangement can have one or a plurality of structured electrodes in order to be able to apply an electric field of predeterminable strength to the regions of an active layer which are assigned to the individual mirror elements independently of one another.

A multilayer arrangement has a multiplicity of layer pairs each comprising a layer composed of a relatively high refractive index layer material and a layer composed of a (relative thereto) low refractive index layer material. Such layer pairs are also referred to as a "double layer" or "bilayer". A layer arrangement having a large number of layer pairs acts in the manner of a "Distributed Bragg Reflector". In this case, the layer arrangement simulates a crystal whose lattice planes leading to Bragg reflection are formed by the layers of the material having the lower real part of the refractive index. The optimum period thickness of the layer pairs is determined by the Bragg equation for a predetermined wavelength and for a predetermined angle of incidence (range) and is generally between 1 nm and 10 nm.

A layer pair can also have, in addition to the two layers composed of relatively high refractive index and relatively low refractive index material, respectively, one or a plurality of further layers, for example an interposed barrier layer for reducing interdiffusion between adjacent layers.

The multilayer arrangement of a mirror element has at least one active layer which is arranged between a radiation entrance surface and the substrate and which consists of a piezoelectrically active layer material. On account of this material property of the active layer material, the layer thickness of the active layer can be altered by applying an electrical voltage. For each active layer provision is made of an electrode arrangement for generating an electric field acting on the active layer. It is thereby possible for the active layers of the mirror elements to be activated independently of one another as necessary and thus to be altered with regard to their layer thicknesses. As a consequence thereof, the reflection properties of the EUV mirror arrangement can be influenced locally differently over the mirror surface.

This makes use of the inverse piezoelectric effect, in which the active layer material deforms reversibly under the action of an electric field. In this case, the crystalline active layer material does not undergo a phase transformation, rather a displacement of positive and negative charge centroids within the crystal structure of the electrically non-conductive active layer material merely takes place.

One electrode of the electrode arrangement can be in touching contact with the active layer. It is also possible to arrange one or a plurality of electrodes at a distance from the active layer to be influenced, as long as the electric field can permeate the material-filled or material-free interspace as far as the active layer. Consequently, one or a plurality of layers of the layer arrangement can also be situated between an electrode and the active layer. In particular, for generating the electric field, a voltage can be applied between an outer layer of a layer arrangement remote from the substrate and an inner layer of a layer arrangement near the substrate, wherein a large number of layer pairs are respectively situated between the electrode layers and the active layer.

In this case, the lateral resolution (spatial resolution) of the influence is dependent on the lateral dimensions of the element mirror surfaces of the individual mirror elements. Depending on the application, lateral dimensions can be e.g. in the range of one or a plurality of millimeters or centimeters. Smaller lateral dimensions, e.g. of between 1 µm and 900 µm, are likewise possible. More than 10 or more than 100 or more than 1000 mirror elements which can be driven independently of one another can be provided in the mirror surface of the mirror arrangement. It can also suffice to provide fewer than 10, for example only two or three or four separately driveable mirror elements. This can be useful e.g. for alignment purposes or calibration purposes.

At least one active layer whose layer thickness can be altered in a targeted manner by the electrical driving of the assigned electrode arrangement is integrated into the multilayer arrangement.

There are various possibilities for arranging the at least one active layer with respect to the layer pairs of the multilayer arrangement.

In some embodiments, the multilayer arrangement has a first layer group arranged between the radiation entrance surface and the active layer and having a first number N1 of layer pairs, and a second layer group arranged between the active layer and the substrate and having a second number N2 of layer pairs, wherein the numbers N1 and N2 of layer pairs of the first layer group and of the second layer group are selected in such a way that, for at least one angle of incidence of the radiation impinging on the radiation entrance surface, the first layer group transmits a portion of the incident radiation through the active layer to the second layer group and the radiation reflected by the multilayer arrangement contains a first portion reflected by the first layer group and a second portion reflected by the second layer group.

In general, the first and second layer groups in each case have a plurality of layer pairs, e.g. in each case 10 or more, or 15 or more, layer pairs.

In this case, both the first layer group remote from the substrate and the second layer group near the substrate contribute to the total reflectivity of a mirror element. By means of the interposed active layer, the distance between the layer groups (measured perpendicularly to the layer surface) can be altered by applying an external voltage. The layer construction of the first layer group is preferably chosen such that, for the angle of incidence or angle-of-incidence range considered, constructive interference of the portions of radiation (partial waves), reflected at the individual interfaces within the first layer group occurs.

The same correspondingly preferably applies to the layers of the second layer group as well. The interposed active layer introduces an optical path length difference or a phase shift between the portions of radiation reflected at the first layer group and the portions of radiation reflected at the second layer group. By applying an external voltage, it is possible for the extent of the phase shift to be varied in a continuously variable manner.

If, by way of example, the phase shift introduced, in the absence of an electric field, is substantially one wavelength or an integral multiple of the wavelength of the electromagnetic radiation, then the first portion and the second portion of the reflected radiation interfere constructively with one another, such that the total reflectivity of the mirror element can lie in the range of the maximum possible reflectivity applicable to the angle-of-incidence range. By contrast, if the layer thickness of the active layer is set such that the phase shift between the first and second portions is in the range of one half wavelength or in the range of three half wavelengths, etc., then destructive interference takes place between the first portion and the second portion, such that the total reflectivity resulting from the first portion and the second portion is lower than the maximum reflectivity maximally possible with the layer groups.

If, by way of example, the change in the optical path length upon single passage through the active layer is one quarter of the operating wavelength, and if the active layer is positioned at a suitable depth in such a way that the first and second portions have substantially the same intensity, then the reflection can be substantially completely suppressed. Between these extremes (maximum reflectivity of a mirror element and complete suppression of the reflection of a mirror element) numerous variants arise which will be explained in greater detail in connection with the exemplary embodiments.

The active layer integrated between the first and second layer groups acts in the manner of an integrated Fabry-Perot interferometer (etalons) with an electrically adjustable distance between its interfaces having a reflective effect.

In many cases it is not necessary or required to vary the reflectivity of a mirror element between maximum reflection and complete suppression of reflection. It often suffices if the degree of reflection of a mirror element is varied only by a maximum of 20% or a maximum of 10%. In some embodiments, the active layer, in the absence of an electric field, has a layer thickness chosen in such a way that for a reference angle of incidence of the incident radiation a reflectivity of the multilayer arrangement can be altered by a maximum of 20%, in particular a maximum of 10%, by applying an electric field.

Preferably, exactly one active layer is provided between two adjacent layer groups each having a plurality of layer pairs. It is thereby possible, inter alia, for the risk of incorrect coating on account of manufacturing tolerances to be kept small. Moreover, this results in only a low complexity between the transmitted and the absorbed portions of radiation. However, a multilayer arrangement can also have more than one active layer which is arranged between two adjacent layer groups having a plurality of layer pairs and which serves for the controllable phase shift between the reflected portions of radiation of these layer groups. By way of example, two or three of such active layers can be provided, between which layer groups having a plurality of layer pairs are then likewise situated.

In the selection of active layer materials for such an integrated active layer, consideration should be given to ensuring that the layer material on the one hand has only relatively low absorption for the radiation to be transmitted to the second layer group and on the other hand enables a sufficiently great "swing" of the layer thickness for the control of the phase shift. In some embodiments, the active layer material substantially consists of barium titanate (Ba-TiO$_3$).

Generally, for the piezoelectrically active layer preference is given to layer materials which, in the EUV wavelength range chosen, have a relatively low absorption (low extinction coefficient or imaginary part of the complex refractive index) and at the same time exhibit a relatively great piezoelectric effect in order to be able to produce sufficiently great changes in layer thickness. The piezoelectrically active layer material can be a material having a perovskite structure which exhibits a relatively great piezoelectric effect. In particular, the piezoelectrically active layer material can be selected from the group: Ba(Sr,Zr)TiO$_3$, Bi(Al,Fe)O$_3$, (Bi,Ga)O$_3$, (Bi,Sc)O$_3$, CdS, (Li,Na, K)(Nb,Ta)O$_3$, Pb(Cd,Co,Fe,In,Mg,Ni,Sc,Yb,Zn,Zr) (Nb,W,Ta,Ti)O$_3$, ZnO, ZnS or contain at least one material of this group in combination with at least one other material. In this case, the notation (A,B) denotes that an element or ion of the type A or an element or ion of type B can be present in a specific lattice position of the crystal structure.

In other embodiments, the multilayer arrangement has a multiplicity of active layers composed of a piezoelectrically active layer material, wherein the active layers are respectively arranged alternatively with layers composed of a non-piezoelectrically active layer material. In this case, the layers arranged between the active layers preferably consist of an electrically conductive layer material, such that these layers can simultaneously serve as electrode layers for the active layers respectively arranged therebetween. The active layer material can be, in comparison with the non-active layer material, either the relatively high refractive index or the relatively low refractive index layer material. An active layer material having relatively high absorption can advantageously be used as an absorber layer.

In this configuration, by applying an electric field to the active layers, it is possible to produce an, if appropriate continuously variable, variation of the layer period within the multilayer arrangement. In this case, the layer period denotes the distance measured perpendicularly to the layer surface between the bounding outer interfaces of a layer pair. Since, for a given operating wavelength and a given angle of incidence, only specific layer periods lead to full constructive interference and hence to a maximum degree of reflection, by varying the layer period it is possible to alter the reflectivity of the multilayer arrangement of the mirror element at the operating wavelength in a continuously variable manner. Furthermore, the phase of the reflected radiation is influenced, such that a spatially resolving wavefront influencing is also possible.

The detuning or changing of the layer period can also be used to adapt the reflectivity to a central wavelength possibly deviating from the desired value, such that e.g. a compensation of variations of the source spectrum or of the spectral transmission of the overall optical system can be carried out. Alternatively or additionally, adaption to desirably or undesirably altered angles of incidence on the mirror is also possible.

In embodiments comprising a multiplicity of active layers composed of a piezoelectrically active layer material and arranged alternatively with non-active layers composed of a non-piezoelectrically active layer material, it is also possible to generate a non-periodic layer structure. To this end, the individual non-active layers formed by electrically conductive, non-piezoelectrically active layer material can be connected to individual outputs of a voltage source so that the field strength of electric field affecting the different active layers can be set differently, if required. Active layers with differing thickness can be obtained depending on the voltages applied to each pair of electrodes. A broadband spectral reflectivity response may be obtained.

In multilayer arrangements having a multiplicity of active layers, consideration should be given particularly to ensuring that the active layer material has low absorptions for the used radiation. In this connection it has proved to be advantageous if the active layer material predominantly or exclusively consists of a ceramic material of the type (Li, Na, K)(Nb, Ti)$O_3$. Such materials are described, e.g. in EP 2 050 726 A2. These materials can also be advantageous from health aspects, since they do not contain lead (Pb).

In particular, the active layer material can contain or consist of a material from the group potassium niobate ($KNbO_3$), lithium niobate ($LiNbO_3$), $PbNb_2O_6$ and sodium potassium niobate ($Na_{0.9}K_{0.1}NbO_3$) or of a combination of these materials. These materials are distinguished, inter alia, by particularly low absorption in the EUV range.

It is also possible to design the EUV mirror arrangement such that, substantially without influencing the local distribution of the reflectivity, a spatially resolving phase correction of the wavefront of the impinging radiation is possible. Such embodiments can be used, in particular, as a mirror in an EUV projection lens. In some embodiments of this type, the multilayer arrangement has a third layer group arranged between the radiation entrance surface and the active layer and having a third number N3 of layer pairs, wherein the third number N3 is selected in such a way that, for at least one angle of incidents of the radiation impinging on the radiation entrance surface, the third layer group substantially completely reflects or absorbs the incident radiation before the latter reaches the active layer. By way of example, at least 20 or at least 30 or at least 40 layer pairs can be provided. Typically, there are fewer than 70 or fewer than 60 layer pairs.

In this case, the reflectivity (or the degree of reflection) of the mirror element is practically exclusively determined by the layer construction of the third layer group. This can be raised or lowered with the aid of the active layer with respect to the substrate by applying an electrical voltage without tilting perpendicularly to the layer surface as a whole.

The layer thicknesses of the individual layers of the layer pairs and, if appropriate, also of the active layer are generally of the order of magnitude of a few nanometers. In order to minimize the influence of interface roughnesses on the optical effect of the mirror elements, in preferred embodiments provision is made for applying the active layer and/or possible electrode layers with the aid of pulsed laser deposition (PLD), such that the active layer and/or an electrode layer are/is present as a PLD layer. With the aid of pulsed laser deposition it is possible to produce very thin layers having little surface roughness. As necessary, it is also possible to produce monocrystalline piezoelectric layer materials having a high piezoelectric coefficient, the surface of which can then be used without polishing as a contact surface for further layers.

Preferably, at least that layer to which the active layer is applied is produced as a crystalline (non-amorphous) layer, in particular with the aid of pulsed laser deposition. This facilitates crystal growth of the active layer. The latter can, in favourable cases, grow epitaxially with respect to an underlying crystalline layer. In some embodiments, most or all of the layers lying between the substrate and active layer are crystalline.

In some embodiments, the electrode arrangement of a mirror element has a first electrode layer and a second electrode layer and the active layer is arranged between the electrode layers. What can thereby be achieved is that the electric field permeates the active layer substantially perpendicularly to the layer surface, as a result of which the changes in layer thickness can be produced particularly effectively. An electrode layer can consist of a metallic layer material or of a semimetal, such as silicon, for example. Electrode layers composed of silicon can be arranged for example alternately with active layers composed of a piezoelectrically active layer material.

An electrode layer may consist of a single layer or may comprise a plurality of single layers stacked on top of each other to form a layer stack (or multilayer).

In some embodiments comprising a laterally structured layer electrode, the electrode arrangement comprises a common electrode opposite to the structured layer electrode, the common electrode extending over a plurality of mirror elements or all mirror elements. When connected to a voltage source the common electrode may serve as a common reference potential for each of the electrode segments arranged on the other side of the active layer opposite thereto. The electrode segments may be set to different voltage values to adjust the thickness of the active layer in a locally varying manner.

The common electrode may be formed on the substrate side of the active layer. In some embodiments the common electrode is formed on the radiation incidence side of the active layer, i.e. opposite to the substrate. In this case it may be advantageous if the common electrode comprises a plurality of single layers stacked on top of each other to form a layer stack, or multilayer. A smooth uninterrupted reflective surface of the mirror arrangement may be obtained.

In some cases it has proved to be advantageous if an electrode layer consists of an electrically conductive ceramic material, for example of $SrRuO_3$ or aluminium nitride (AlN). The use of electrically conductive ceramic materials as electrode material, in conjunction with ceramic active layer materials, allows the lattice mismatch at the interfaces between electrode layer and active layer material to be kept small, as a result of which layer stresses in the region of the interfaces and hence the risk of layer detachment can be kept low and, consequently, the lifetime of the layer arrangement can be improved.

The invention also relates to an optical system comprising at least one EUV mirror arrangement. The optical system can be, in particular, an illumination system of a microlithography projection exposure apparatus. The EUV mirror arrangement can be arranged in the beam path of the illumination system between a light source and an illumination field to be illuminated in or near a field plane which is situated in a manner optically conjugate with respect to a plane of the illumination field. In this case, the EUV mirror arrangement can serve as a field facet mirror. Alternatively or additionally, an EUV mirror arrangement can be arranged in the region of a pupil plane of the illumination system, that is to say in the region of a plane which is situated in the manner Fourier-transformed with respect to the plane of the illumination field. In this case, the EUV mirror arrangement can serve as a pupil facet mirror. The optical system can also be a projection lens of a microlithography projection exposure apparatus.

In a method for operating an optical system comprising at least one EUV mirror arrangement of this type, the local reflectivity distribution over the mirror surface of the EUV mirror arrangement can be varied in a location-dependent manner by selectively driving individual or all of the active layers. If an EUV mirror arrangement is in this case arranged in the region of a field plane of the optical system, it is thereby possible to influence the illumination intensity distribution in said field plane and in field planes that are optically conjugate with respect thereto. In the case of an arrangement in the region of a pupil plane, by locally changing the reflectivities it is possible to alter the illumination intensity distribution in the illumination field in an angle-dependent manner.

These and further features emerge not only from the claims but also from the description and the drawings, wherein the individual features can be realized in each case by themselves or as a plurality in the form of subcombinations in an embodiment of the invention and in other fields and can constitute advantageous and inherently protectable embodiments. Exemplary embodiments are illustrated in the drawings and are explained in greater detail below.

BRIEF DESCRIPTION OF THE DRAWINGS

FIG. 5 shows a diagram of the reflectivity profile in the region of a reflection maximum, in the case of which it is possible to obtain a setting range $\Delta R$ of the reflectivity of approximately 2.5% given a layer thickness variation $\Delta z$ of 0.127 nm;

FIG. 6 shows a diagram with reflectivity and transmission profiles of a multilayer arrangement which can be used as a beam splitter with transmission that can be set in a variable manner;

DETAILED DESCRIPTION OF EXEMPLARY EMBODIMENTS

Figure 1:
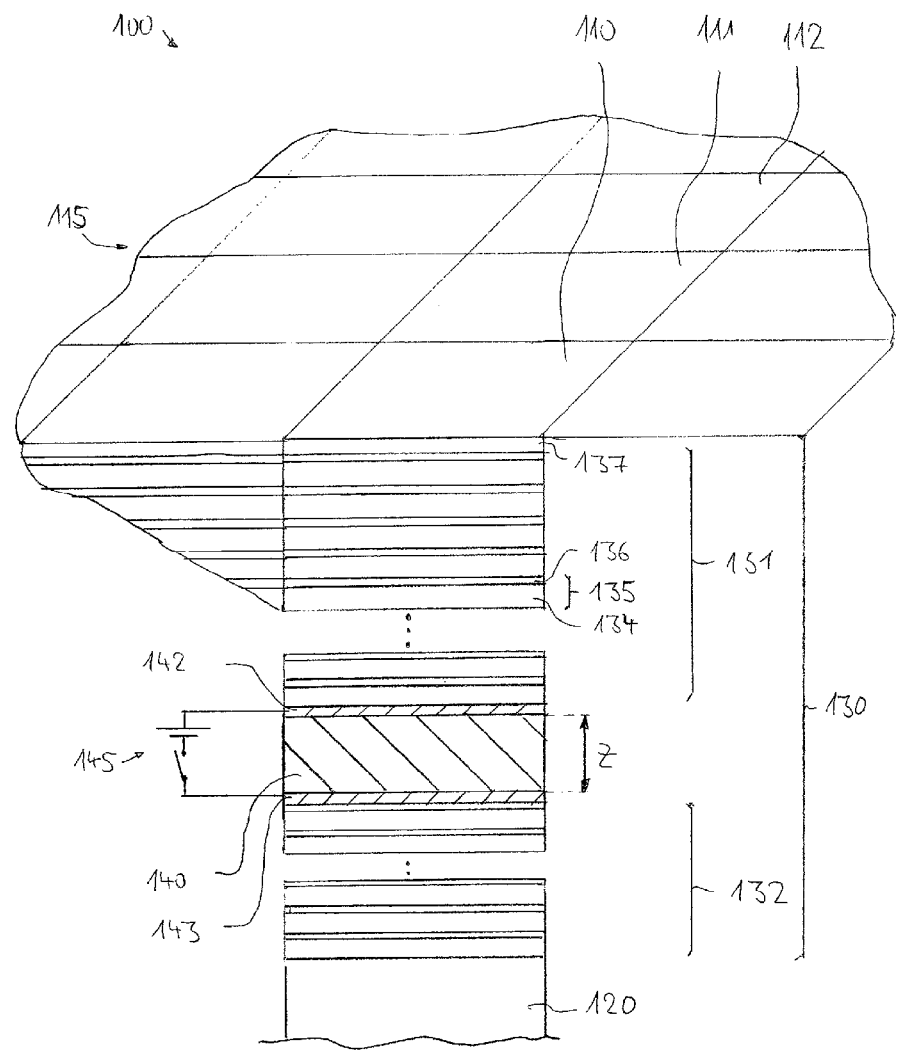
FIG. 1 shows a schematic, obliquely perspective illustration of an embodiment of an EUV mirror arrangement in partial section.

FIG. 1 shows a schematic, obliquely perspective illustration of an embodiment of an EUV mirror arrangement 100 in partial section. The mirror arrangement has a multiplicity of mirror elements 110, 111, 112 which are arranged alongside one another and which each have a rectangular cross section in the case of the example. Each mirror element can be designated as an individual mirror and has a rectangular element mirror surface, wherein the element mirror surfaces adjoin one another largely without any gaps or lie aside one another with interspaces and jointly form a mirror surface 115 of the mirror arrangement. The mirror surface can be flat (plane mirror) or curved (e.g. convex mirror, concave mirror, cylindrical mirror, etc.) overall.

The construction of a mirror element will be explained in greater detail on the basis of the mirror element 110. Each mirror element has a substrate 120, which can consist, for example, of metal, silicon, a glass, a ceramic material, a glass ceramic or a composite material. On a substrate surface processed in a smooth fashion with high precision, a multilayer arrangement 130 having a reflective effect with respect to radiation from the extreme ultraviolet range is applied by suitable coating technology. For producing some or all of the individual layers, it is possible to use e.g. magnetron sputtering, electron beam sputtering or ion beam sputtering. If a crystalline layer structure is desired, it is also possible to effect coating by means of pulsed layer deposition (PLD), for example.

The multilayer arrangement has a multiplicity of layer pairs (bilayers) 135 each having alternately applied layers of a layer material having a higher real part of the refractive index (also called "spacer") and a layer material having relative thereto a lower real part of the refractive index (also called "absorber"). In the case of the example, relatively thin layers 136 comprising molybdenum (Mo) as absorber material are applied alternately with relative thereto thicker layers 134 comprising silicon (Si) as spacer material. A layer pair can also contain at least one further layer, in particular an interposed barrier layer, which can consist e.g. of C, $B_4C$, $Si_xN_y$, SiC or a composition comprising one of said materials and is intended to prevent interdiffusion at the interface. It is thereby possible to ensure permanently sharply defined interfaces including under radiation loading.

The layer pairs are grouped into two layer groups. A first layer group 131 remote from the substrate and near the surface has a first number N1 of layer pairs 135. In the case of the example, a cap layer 137 for protecting the underlying layers is also applied between the first layer group and the radiation entrance surface remote from the substrate. The cap layer can consist e.g. of ruthenium, rhodium, gold, palladium, $Si_xN_y$ or SiC or contain one of said materials. The free surface of the cap layer forms the radiation entrance surface.

A second layer group 132 near the substrate has a second number N2 of layer pairs 135. This second layer group can be applied directly to the substrate surface, but it is also possible to provide a single- or multilayered intermediate layer functioning as a smoothing layer, for example. The layers of the second layer group near the substrate are preferably produced as crystalline layers, in particular by means of pulsed laser deposition (PLD).

An individual active layer 140 composed of a piezoelectrically active layer material is arranged between the first layer group 131 and the second layer group 132. The layer thickness z of the active layer can be altered by applying an electric field to the active layer material. For this purpose, in direct contact with the active layer, a first electrode layer 142 is arranged between said active layer and the first layer group and a second electrode layer 143 is arranged between the active layer and the second layer group. The electrode layers in areal contact with the active layer material consist of an electrically conductive layer material and are connected by electrically conductive connections to a switchable or regulable voltage source 145. The layer thickness z can be varied, in a manner dependent on the voltage generated by the voltage source, continuously variably between a minimum value $z_{min}$ (in the absence of an electric field) and a maximum value $z_{max}$.

A corresponding electrode arrangement is provided for each of the mirror elements. The electrode arrangements can be driven independently of one another, such that, for each mirror element, the active layer thereof can be altered with regard to its layer thickness by applying electrical voltage independently of the active layers of other mirror elements.

Both the first layer group 131 and the second layer group 132 are designed, with regard to the layer thicknesses of the spacer and absorber layers, such that they have a reflective effect with respect to the angle-of-incidence range with which the mirror arrangement is intended to be operated. In this case, the first number N1 of layer pairs of the first layer group 131 near the surface is chosen such that said layer group reflects only part of the radiation incident at the mirror surface by Bragg reflection and another portion of the incident radiation is transmitted through the active layer 140 to the second layer group 132. The second number N2 of layer pairs of the second layer group is chosen such that said portion transmitted to the second layer group is practically completely reflected (and, if appropriate, partly absorbed) by the second layer group.

The portion reflected by the second layer group 132 is reflected back through the active layer and through the first layer group. Accordingly, the radiation reflected overall by the layer arrangement contains a first portion reflected by the first layer group and a second portion reflected by the second layer group. The resultant total reflectivity of the multilayer arrangement (that is to say the ratio between reflected and incident intensity, represented by the degree of reflection or reflectivity R) is in this case determined by interference between the partial waves reflected by the first layer group 131 and the partial waves reflected by the second layer group 132. In this case, the type and extent of the interference can be altered separately for each mirror element by altering the layer thickness of the active layer, such that within predetermined setting limits it is possible to alter the weighting between portions of destructive interference and constructive interference. In this case, the extent of interference is determined by the optical angular length difference (phase difference), between the partial waves reflected by the lower second layer group 132 and the partial waves reflected by the upper first layer group 131. This basic principle will be explained in greater detail below on the basis of calculated exemplary embodiments.

In the calculated exemplary embodiment, barium titanate ($BaTiO_3$) is used as active layer material for the active layer 140. The first electrode 142 and the second electrode 143 are respectively formed by layers composed of $SrRuO_3$. This electrically conductive ceramic material exhibits relatively little lattice mismatch in contact with barium titanate. Alternatively, for example, aluminium nitride (AlN) or some other electrically conductive material, for example a metallic material, can be used. The layer pairs 135 consist, as mentioned, of molybdenum as absorber material and silicon as spacer material.

At least the lower electrode layer 143 on the substrate side is present as crystalline layers; it can be produced by means of pulsed laser deposition (PLD), in particular. The crystal surface then serves as a support for the growth of the active layer, which is likewise a crystalline layer applied by means of PLD. On account of the small lattice mismatch, if appropriate epitaxial growth of a monocrystalline active layer on a monocrystalline lower electrode layer is possible.

Depending on the layer thickness of the active layer and the coating method used for producing it, its surface can be relatively rough. In order to improve the growth conditions for subsequent layers, it is possible to apply to the active layer a smoothing layer, e.g. composed of amorphous silicon, the surface of which can then be polished smooth by means of an ion beam before the next layer is applied. Said smoothing layer can serve as an electrode layer.

In order to demonstrate the effect of the layer thickness z of the active material, examples are presented below which were calculated for an operating wavelength $\lambda=13.5$ nm of the EUV radiation and normal radiation incidence (angle of incidence AOI=0°). In this case, the term "angle of incidence" denotes the angle between the direction of incidence of a ray and the normal to the surface of the mirror at the point where the ray impinges on the mirror. The starting structure shall consist of 10 Mo/Si layer pairs in the first layer group 131 (i.e. N1=10) and likewise 10 Mo/Si layer pairs in the second layer group 132 (i.e. N2=10). Given a layer thickness of the Mo layers of 2.76 nm and 4.14 nm for the Si layers, this results in a periodicity length d=6.9 nm for the stack of layer pairs. The layer thickness of the electrode layers 142, 143 is 2.76 nm in each case. The layer thickness z of the active layer is variable.

Figure 2:
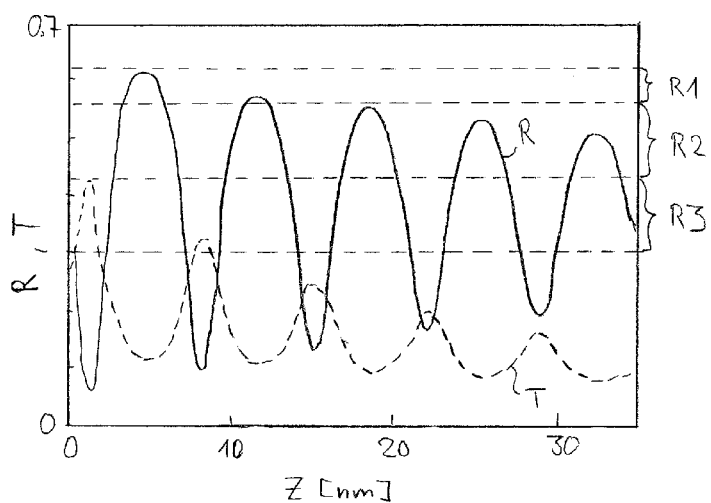
FIG. 2 shows a diagram for elucidating the influence of the layer thickness of an active layer on the reflectivity R and the transmittance T of the entire layer arrangement.

For elucidating the influence of the layer thickness on the reflectivity R and the transmittance T of the entire layer arrangement, FIG. 2 shows a corresponding diagram illustrating the reflectivity R and the transmittance T as a function of the layer thickness z [nm] for the above example. Depending on the layer thickness z and the phase difference caused thereby between the portions of radiation reflected by the layer groups, periodic changes result as the layer thickness z increases, thus giving rise to maxima (peaks) and minima (valleys) in the curves, wherein the maxima of the transmission T naturally lie in the region of the minima of the reflectance R.

The layer thickness z can now be defined with respect to various target stipulations. In the first region R1 bounded by horizontal dashed lines, in the case of layer thicknesses of around 5 nm and around 12 nm there are respectively regions with maximum reflectivity R. In these regions, on account of the small gradient of the reflectivity curve, for a given layer thickness variation Δz, only a relatively small setting range (tuning range) arises for the variation of the total reflectivity. The second region R2 lying underneath covers the regions with a relatively high gradient of the reflectivity curves respectively on the left and right of the reflectivity maxima. For a given layer thickness variation Δz of the active layer, here particularly large setting ranges ΔR arise for the total reflectivity (cf. FIG. 5), but the absolute value of the reflectivity is somewhat smaller than in the regions of maximum reflectivity (region R1). The third region R3 marks the regions of minimum reflectivity and corresponding maximum transmission of the layer arrangement. If corresponding layer thicknesses of the active layer are chosen, the layer arrangement can also be used as a beam splitter layer having a settable ratio between reflectivity and transmission.

Figure 3:
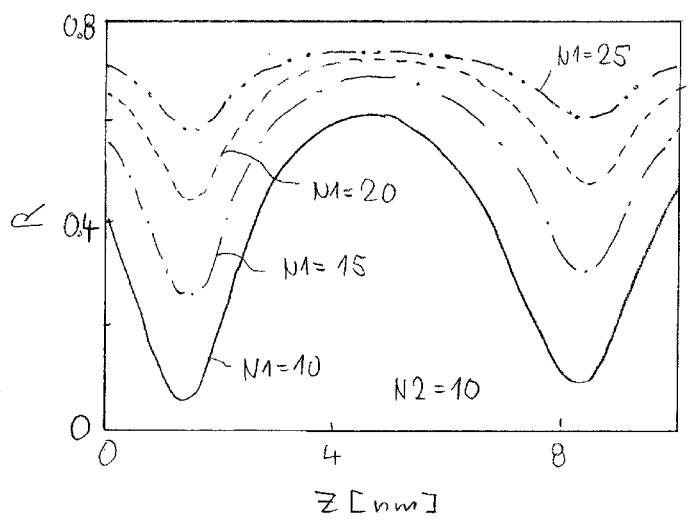
FIG. 3 shows a diagram concerning the influence of the number of layer pairs in the first layer group remote from the substrate on the reflectivity profile as the layer thickness of the active layer increases.

The influence of the number of layer pairs in the first layer group 131 remote from the substrate on the reflectivity profile as the layer thickness z increases will now be elucidated with reference to FIG. 3. In this respect, FIG. 3 shows the region of the first reflectivity maximum (in the case of layer thicknesses z of around 5 nm), wherein the second number N2=10 remains constant and the first number N1 of layer pairs in the first layer group near the surface varies between N1=10 and N1=25. It can be discerned that the maximum reflectivity in the region of the first reflectivity maximum increases from approximately 0.6 to approximately 0.72 as N1 increases, and that the indentations in the region of the adjacent reflectivity minima become shallower, such that the reflectivity varies over the layer thickness for N1=25 only between R=0.6 and R=0.72.

Figure 4A:
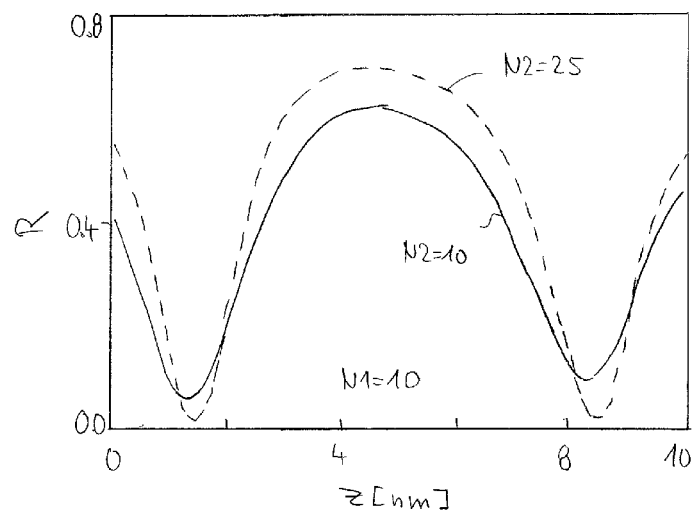
FIG. 4A shows a diagram concerning the reflectivity profile in the region of a reflectivity maximum with an increasing number of layer pairs in the second layer group closest to the substrate, with a constant number of layer pairs in the first layer group.

It is demonstrated with reference to FIG. 4A how the reflectivity profile in the region of the reflectivity maximum behaves with an increasing number of the layer pairs in the second layer group 132 closest to the substrate given a constant number N1=10 of the layer pairs in the first layer group. With an increasing number of layer pairs in the second layer group closest to the substrate, the maximum reflectivity increases from approximately 0.6 to approximately 0.7 in the region of the reflectivity maximum, while the decrease in the reflectivity in the region of the adjoining reflectivity minima (at approximately z=1.5 nm and z=8.4 nm) increases.

It is evident from this that there are many pairings of first and second layer groups (corresponding to first numbers N1 and second numbers N2) which produce a high reflectivity in the vicinity of the absolute reflectivity maximum. On the basis of these curves it is possible to select pairings of first and second numbers N1 and N2, respectively, which allow a large setting range with a varying layer thickness z of the active layer in conjunction with relatively high total reflectivity.

It should be noted that the maximum reflectivity cannot be increased arbitrarily by a larger number of layer pairs. Rather, e.g. in the case of Mo/Si layer pairs, experience shows that saturation arises at approximately 50 layer pairs.

In the exemplary calculations, the maximum number of layer pairs (N1+N2) was limited to 48, since higher numbers of layers hardly entail any significant changes to the overall behaviour.

The setting range (tuning range) is primarily determined by the elasticity and the yield stress of the piezoelectrically active layer material. When the yield stress ($\sigma_y$) is exceeded, an irreversible deformation of the layer material commences. The yield stress is linked to the elasticity (described by the modulus of elasticity E, also called Young's modulus) of the material and the dimensional change or deformation of the material, for which the strain ε serves as a normalized measure. The relationship between the dimensional change (strain) of the layer thickness which is possible without plastic deformation of the material ($\epsilon_{max}=\Delta z/z$), the yield stress and the modulus of elasticity is given by $\epsilon_{max}=\sigma_y/E$. In this case, z is the initial layer thickness and Δz is the change in layer thickness. The yield stress for piezoelectric materials is typically between 1% and 5% and is approximately 4.8% for $BaTiO_3$ (R. F. Cook, C. J. Fairbanks, B. R. Lawn and Y.-W. Mai "Crack Resistance by Interfacial Bridging: Its Role in Determining Strength Characteristics," J. Mater Res., 2, 345-356 (1987)).

Furthermore, the layer thickness of the active layer prior to layer expansion shall be described by $z_{min}$ and the change in layer thickness by Δz. Depending on which side of a reflectivity maximum is taken as a basis for considering the optimization process, the thickness of the piezoelectric material at the minimum reflectivity of the setting range and the maximum reflectivity of the setting range shall be given by $z_{max}=z_{min}+\Delta z$. Using this information and the yield stress of $BaTiO_3$ ($\sigma_y=\Delta z/z_{min}$), it is possible to calculate $z_{min}$, $z_{max}$ and Δz. If, by way of example, the desired maximum reflectance is set to $R_{max}$=72% and the number of layer pairs (N1 or N2) is limited to 48, the values for the first five reflection maxima (peak 1 to peak 5) indicated in Table 1 are obtained. In this case, $N1=N_1$ and $N2=N_2$ hold true.

The values $z_{min}$, $z_{max}$ and Δz are indicated in Tables 1, 2 and 3 respectively in the unit $10^{-10}$ m or 0.1 nm (corresponding to the conventional, but no longer generally permissible length unit Å (Ångstrom)).

Figure 4B:
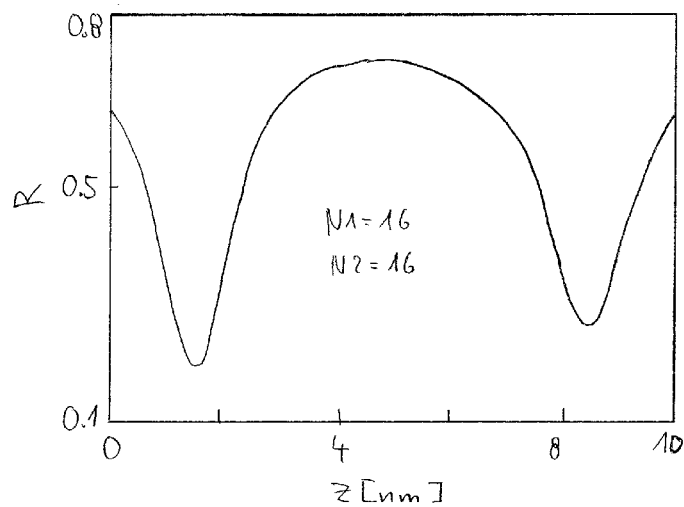
FIG. 4B shows a diagram concerning the reflectivity profile in the region of a first reflectivity maximum.

One appropriate solution in the region of the first reflection maximum (in the case of layer thicknesses z of approximately 5 nm) is shown in FIG. 4B, where here $R_{max}$=72%, N1=16 and N2=16.

TABLE 1

| | $N_1$ | $N_2$ | $R_{max}$ | $R_{min}$ | ΔR | $z_{max}$ | $z_{min}$ | Δz |
|---|---|---|---|---|---|---|---|---|
| Peak 1 | 16 | 16 | 72.0455 | 71.9528 | 0.0927 | 45.50 | 43.4160 | 2.0840 |
| Peak 2 | 16 | 36 | 72.0044 | 71.5439 | 0.4605 | 115.25 | 109.9714 | 5.2786 |
| Peak 3 | 19 | 25 | 72.0210 | 71.0087 | 1.0123 | 185.75 | 177.2424 | 8.5076 |
| Peak 4 | 21 | 48 | 72.4302 | 70.8417 | 1.5886 | 255.50 | 243.7977 | 11.7023 |
| Peak 5 | 22 | 48 | 72.2566 | 69.4827 | 2.7739 | 325.25 | 310.3531 | 14.8969 |

If a layer construction is intended to be optimized with regard to a maximum setting range of the reflectivity in conjunction with a relatively high reflectance, the range in the second region R2 in FIG. 2 is preferably employed. In this range it is possible to achieve large setting ranges in conjunction with relatively small dimensional changes (changes in layer thickness) of the active layer, the maximum reflectance not quite being achievable there. However, if, for example, the minimum reflectivity is limited to 65%, then it is possible, for example, to obtain a particularly large setting range with N1=18 and N2=28 in the region of the first reflection maximum. The results of an optimization in the region of the first reflection maxima are compiled in Table 2.

TABLE 2

|  | $N_1$ | $N_2$ | $R_{max}$ | $R_{min}$ | $\Delta R$ | $z_{max}$ | $z_{min}$ | $\Delta z$ |
|---|---|---|---|---|---|---|---|---|
| Peak 1 | 18 | 28 | 67.5713 | 65.0722 | 2.4992 | 27.7720 | 26.5 | 1.2720 |
| Peak 2 | 28 | 48 | 71.0973 | 65.1657 | 5.9317 | 94.3200 | 90 | 4.3200 |
| Peak 3 | 25 | 48 | 72.0965 | 65.1191 | 6.9774 | 169.2520 | 161.5 | 7.7520 |
| Peak 4 | 24 | 29 | 72.1154 | 65.0037 | 7.1117 | 242.6120 | 231.5 | 11.1120 |
| Peak 5 | 24 | 32 | 72.3050 | 65.0045 | 7.3005 | 314.9240 | 300.5 | 14.4240 |

It can be discerned, inter alia, that larger absolute layer thicknesses of the active layer (corresponding to the second, third, fourth, etc. reflectivity maximum), enable a larger layer thickness swing $\Delta z$ and hence a larger setting range $\Delta R$ of the reflectivity. It is possible to choose a suitable compromise with regard to absorption by the active layer.

FIG. 5 shows the reflectivity profile in the region of the first reflection maximum for N1=18 and N2=28. It can be discerned from Table 2 that in this region it is possible to obtain a setting range $\Delta R$ of the reflectivity of approximately 2.5% given a layer thickness variation $\Delta z$ of 0.127 nm.

In one embodiment, in particular at least one of the following conditions can hold true:

$$10 < N1 < 30 \quad (1)$$

$$15 < N2 < 50 \quad (2)$$

$$30 < (N1+N2) < 70 \text{ and } N1 > 10 \text{ and } N2 > 10 \quad (3)$$

$$N1 \leq N2 \quad (4)$$

$$z \geq 2 \text{ nm} \quad (5)$$

$$z \leq 35 \text{ nm} \quad (6)$$

$$\Delta z \geq 0.1 \text{ nm} \quad (7)$$

$$0.15 \text{ nm} \leq \Delta z \leq 2 \text{ nm} \quad (8)$$

Finally, it shall also be explained with reference to FIG. 6 that multilayer arrangements of the type described can also be used as a physical beam splitter having a transmission that can be set variably. The third region R3 from FIG. 1 having relatively large values of the transmission is particularly suitable for this application. FIG. 6 shows, by way of example, the region around the second local transmission maximum (corresponding to the first reflectivity minimum), in the case of layer thicknesses z≈1.2 nm. Here too, the calculation was carried out for an angle of incidence AOI=0°. Corresponding results would also arise for the angle-of-incidence range around 45°, which is better suited to the application. In the range considered, for calculation purposes the minimum transmission was set to 30% and the transmittance was varied above this level. Table 3 indicates exemplary values for N1=8 and N2=8. In this case, Tzmin and Rzmin are the transmission and reflectivity, respectively, at the minimum layer thickness zmin, and Tzmax and Rzmax are the corresponding values at the maximum layer thickness zmax.

TABLE 3

| Tzmin | 30.3426 | Rzmin | 28.4563 | zmax | 94.5 |
|---|---|---|---|---|---|
| Tzmax | 36.1263 | Rzmax | 17.2831 | zmin | 90.1718 |
| $\Delta T$ | 5.7837 | $\Delta T$ | 11.1732 | $\Delta z$ | 4.3282 |

Figure 7:
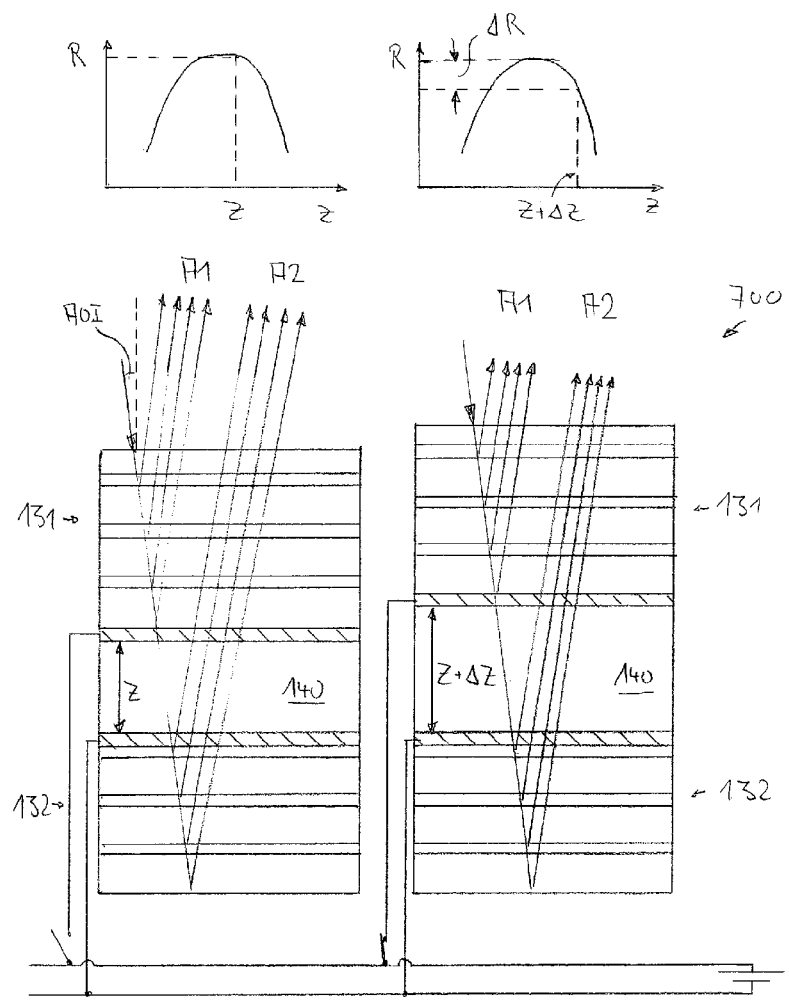
FIG. 7 schematically shows part of an EUV layer arrangement with an activated and a non-activated mirror element.

The functioning of an EUV mirror arrangement 700 is shown schematically with reference to FIG. 7, said EUV mirror arrangement comprising a plurality of mirror elements whose multilayer arrangement in each case has an integrated piezoelectrically active layer 140 between a first layer group 131 near the surface and a second layer group 132 near the substrate. The periodicity of the successive layer pairs shall in each case be adapted to the used angle of incidence AOI such that a maximum reflectivity respectively arises both within the first layer group and within the second layer group. Furthermore, the layer thickness z of the active layer 140, in the absence of an electric field, shall be dimensioned such that full constructive interference arises between the second portion A2 originating from the second layer group and the first portion A1 originating from the first layer group. In the mirror element shown on the left in the case of the example, this leads to a total reflectivity in the vicinity of a reflectivity maximum (see diagram above). The resulting intensity of the reflected radiation is represented by the arrow length of the rays emerging from the mirror surface.

If the intention is then to set a location-dependent variation of the reflectivity over the entire mirror surface, electrical voltages of different magnitudes can be applied to the active layers of the individual mirror elements, such that different layer thicknesses of the active layers are established within the individual mirror elements. In the case of the example, by applying an electrical voltage to the active layer of the right-hand mirror element, this results in an increase in the layer thickness by $\Delta z$. This then leads, by comparison with the case of full constructive interference (left), to a phase shift between the partial waves originating from the first layer group (portion A1) and the partial waves originating from the second layer group (portion A2) in such a way that partial destructive interference occurs. As a result, the reflected total intensity decreases by $\Delta R$ in the case of the example (see diagram above), which is illustrated by the relatively shorter arrows of the emerging rays.

It should be mentioned that each mirror element can have a different operating point or a different nominal layer thickness of the active layer. Layer elements can also have groupwise identical layer thicknesses which differ between two or more groups.

Figure 8:
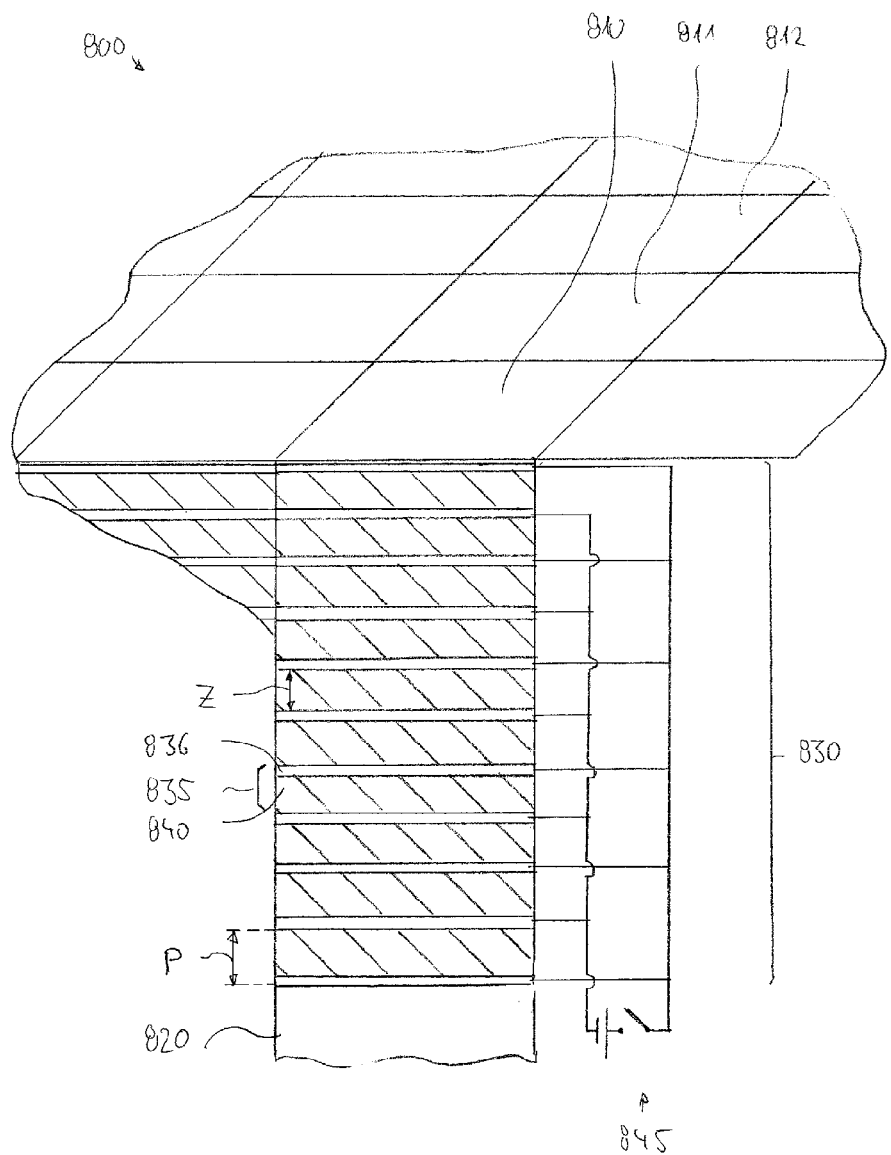
FIG. 8 shows a schematic, obliquely perspective illustration of a further embodiment of an EUV mirror arrangement in partial section.

FIG. 8 schematically shows an EUV mirror arrangement 800 in accordance with a further embodiment in oblique perspective and partial section. This EUV mirror arrangement also has a large number of mirror elements 810, 811, 812 which are arranged alongside one another in rows and columns such that their individual element mirror surfaces overall form the total mirror surface of the mirror arrangement. The layer construction of the mirror element 810 is explained in greater detail by way of example. A multilayer arrangement 830 is applied on a substrate 820 by means of suitable coating techniques. Over the majority of its thickness, the multilayer arrangement has a strictly periodic construction comprising a multiplicity of layer pairs 835 wherein each layer pair has a relatively thin layer 836 composed of a layer material having a relatively low real part of the refractive index and a thicker layer 840 composed of a layer material having a relatively higher real part of the refractive index.

The thicker layers 840 in each case consist of the same, piezoelectrically active layer material and thus form an active layer whose layer thickness can be altered by the action of an electric field. The thinner layers 836 in each case consist of an electrically conductive material. Respectively adjacent layers 836 enclose an individual active layer 840 and serve as electrode layers for the active layer situated therebetween, in order to generate an electric field where an electrical voltage is applied between the adjacent layers 836, said electric field permeating the active layer 840 situated therebetween perpendicularly to the layer surface. The electrode layers 836 are alternately connected to respective poles of a switchable DC voltage source 845 having a voltage that can be set variably.

The periodic arrangement formed by the sequence of electrically non-conductive active layers 840 and electrically conductive electrode layers 836 has a periodicity length P corresponding, in the case of the example, to the layer thickness of a layer pair 835. The periodicity length can be altered in a continuously variable manner by applying an electrical voltage to the electrode layers, since the layer thickness z of the active layers changes in a manner dependent on the applied voltage.

As a result of the variation of the layer period P as a reaction to the application of an electrical voltage, it is possible to influence the reflectivity of the affected mirror element at the operating wavelength. In a manner coupled by the Bragg equation, it is also possible to compensate for changes in reflectivity by slightly detuned operating wavelengths and/or angles of incidence. Since, moreover, the absolute thickness of the entire layer stack, that is to say the distance between the substrate and the element mirror surface of the individual mirror element, increases in the case of an increase in the layer thicknesses of the active layers, the wavefront of the radiation impinging on the mirror surface is also influenced, since, by way of example, upon the element mirror surface being raised, the optical path of the radiation reflected by the element mirror surface is shortened overall. A phase shift can thereby be introduced relative to adjacent non-activated element mirror surfaces or element mirror surfaces raised to a different extent. This embodiment can therefore be used simultaneously for the spatially resolving influencing of the wavefront and for the spatially resolving influencing of the reflectivity.

Since, in this embodiment, overall relatively large thicknesses of the active layer material are traversed by radiation, a material having a low absorption coefficient (imaginary part of the complex refractive index) should be used as active layer material.

The number of layer pairs 835 can be between 10 and 70, for example.

Figure 9:
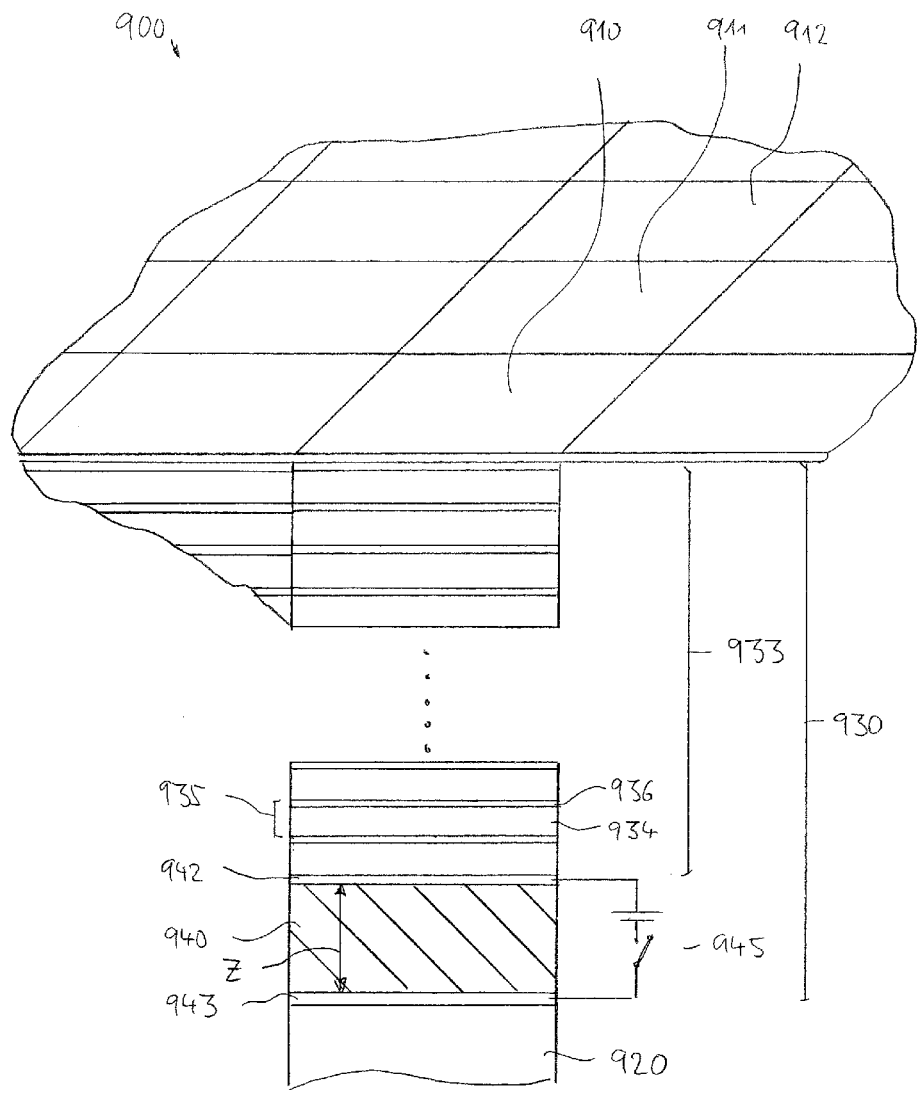
FIG. 9 shows a schematic, obliquely perspective illustration of a further embodiment of an EUV mirror arrangement in partial section.

In the embodiment of an EUV mirror arrangement 900 in FIG. 9, mirror elements 910, 911, 912 are likewise arranged alongside one another in rows and columns substantially in a manner filling the surface area such that their rectangular element mirror surfaces overall form the mirror surface of the mirror arrangement. The layer construction of the multilayer arrangement 930, which is reflective to the EUV radiation, is designed such that the EUV mirror arrangement as a whole can be used as a wavefront correction device that is effective in a spatially resolving fashion, without different spatial distributions of the reflectivity arising for the different operating modes. For this purpose, the multilayer arrangement has, proceeding from the mirror surface, firstly a third layer group 933, which consists of a third number N3 of layer pairs 935 of identical type. Each layer pair (bilayer) has a thinner absorber layer 936 composed of molybdenum and a thicker spacer layer 934 composed of silicon. The number N3 of layer pairs 935 is chosen such that the periodic stack reflects the entire radiation incident from the radiation entrance surface (or else absorbs a relatively small portion thereof). For this purpose, by way of example, between 40 and 50 layer pairs 935 can be provided. The period of the layer pairs is chosen in a manner dependent on the angle-of-incidence range that occurs and the operating wavelength such that maximum or almost maximum reflectivity occurs in accordance with the Bragg equation.

An active layer 940 composed of a piezoelectric active layer material is situated between the third layer group 933 and the substrate 920. Electrode layers 942 and 943 are respectively arranged at the top side and the underside of the active layer, wherein the electrode layer 943 near the substrate can be arranged directly on the substrate 920 or, in other embodiments, on an intermediate layer situated in between. The electrode layers 942, 943 are connected to a switchable DC voltage source 945, by means of which, as necessary, a DC voltage of predeterminable magnitude can be applied between the electrode layers, such that the piezoactive layer 940 is permeated by an electric field and its layer thickness z changes in a manner dependent on the applied voltage.

The active layer 940 and the adjoining electrode layers 943, 942 are in each case applied by means of pulsed laser deposition (PLD). With corresponding method implementation, the layers can be applied as monocrystalline layers, such that the surface of the upper electrode layer 942 to which the Mo/Si layer pairs are subsequently applied has such a low roughness that subsequent polishing can be obviated.

Figure 10A:
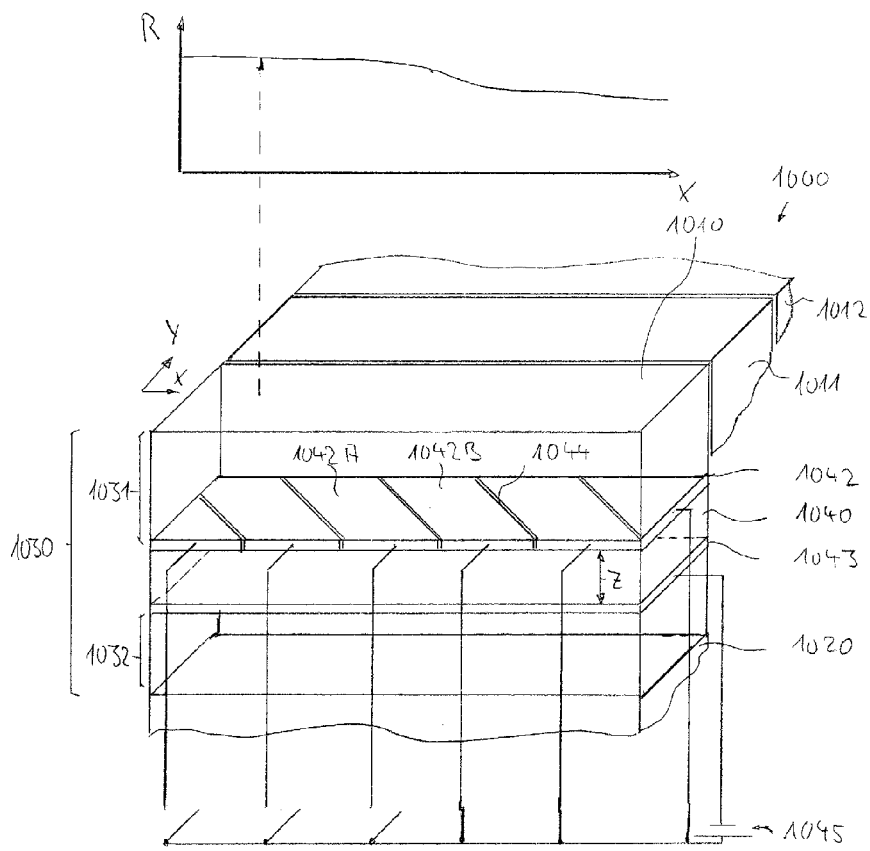
FIG. 10 shows different embodiments of structured layer electrodes in FIGS. 10A, 10B and 10C.

Some variants for using structured electrodes in the construction of mirror arrangements are elucidated in connection with FIGS. 10A to 10C. FIG. 10A shows in oblique perspective a schematic view of three cross-sectionally rectangular mirror elements 1010, 1011, 1012 of a mirror arrangement 1000, which can be used, for example, as a field facet mirror in the region of a field plane of the illumination system of an EUV projection exposure apparatus (cf. FIG. 11). The layer construction of the mirror element 1010 is illustrated in detail. In a manner similar to that in the case of the arrangement from FIG. 1, a multilayer arrangement 1030 composed of many individual layers is applied to a substrate 1020. An individual active layer 1040 composed of piezoelectric active crystalline layer material is arranged between a first layer group 1031 situated in the vicinity of the radiation entrance surface and a second layer group 1032 near the substrate. Both layer groups in each case consist of a plurality of (e.g. between 10 and 30) layer pairs with a suitable layer period and have in each case by themselves a reflective effect on the penetrating EUV radiation. By means of the electrically alterable layer thickness z of the active layer 1040, it is possible to set a specific phase shift that can be set continuously variably with regard to its extent between the second portion reflected by the second layer group 1032 and the first portion reflected by the first layer group 1031.

The electrode arrangement for driving the active layer has a substrate-side second electrode layer 1043 which is continuous over the entire cross section of the mirror element and which is connected to one pole of a settable DC voltage source 1045. The first electrode layer 1042 arranged on the opposite surface of the active layer 1040 is designed as a structured layer electrode and subdivided into a plurality of electrode segments 1042A, 1042B which are situated alongside one another and are electrically insulated from one another. Each of the electrode segment covers only a fraction of the total cross-sectional area of the mirror element, e.g. less than 50% or less than 40% or less than 30% or less than 20% or less than 10%. In general, the area of an individual electrode segment is at least 1% or at least 5% of the total area of the structured layer electrode. A narrow insulating section 1044 composed of an electrically non-conductive layer material is respectively situated between adjacent electrode segments. The insulating regions in each case run obliquely with respect to the long edge (x-direction) and obliquely with respect to the short edge (y-direction) of the mirror element. Further orientations are also possible.

The structured electrode 1042 can be produced with the aid of microlithographic methods, for example.

Each of the electrode segments is connected to the other pole of the DC voltage source 1045 via a separate electrical line and can be put at a suitable potential relative to the continuous second electrode layer 1043 independently of the other electrode segments. In general, there is a separate switchable or continuously variably settable DC voltage source for each electrode segment.

With the aid of the structured electrode it is possible to alter the layer thickness of the active layer 1040 in a location-dependent manner in order to produce a layer thickness profile extending in the x-direction. In accordance with the layer thickness varying in the x-direction, a phase shift of the reflected radiation portions which varies locally in the x-direction is then established, such that, as a consequence thereof, the reflectivity R of this individual mirror element can also be set and varied in a location-dependent manner in the x-direction. The schematic diagram shown above the mirror arrangement shows that a higher total reflectivity R is set in the region of the electrode segments shown on the left than in the region of the opposite narrow side, wherein a transition region is situated between them.

In the case of this mirror arrangement 1000 it is thus possible not only in each case to individually control the reflectivity level of individual mirror elements 1010, 1011, 1012, but also to set a desired profile with varying local reflectivity R within each individual mirror element. Consequently, an individual mirror element in turn forms an EUV mirror arrangement having two or more mirror elements that can be set individually with respect to their reflectivity, wherein the form and size of said mirror elements are determined by the form and size of the electrode segments 1042A, 1042B.

FIGS. 10B and 10C schematically show other structuring geometries of structured layer electrodes which can be used in embodiments of individual mirror elements or of mirror elements of a mirror arrangement equipped with a plurality of mirror elements. The overall circular structured electrode 1050 can be used in a cross-sectionally circular mirror element in combination with a likewise circular counterelectrode which, however, is not subdivided into segments. In the case of the example, the structured electrode has twelve individually driveable electrode segments 1050A, 1050B of identical form and size, which each cover an angular range of approximately 30°. A contact point KP for connecting an electrical connection to a voltage source is provided in each case at the free outer edge of an electrode segment. Such a structured electrode arrangement can be provided, for example, on an individual mirror of a projection lens in order to set a radially symmetrical non-uniform distribution of the reflectivity and/or of the reflected phase at the mirror surface, wherein the reflection behaviour can in each case vary in the azimuthal direction (circumferential direction) and this variation can be set in a targeted manner.

By way of example, it is possible to set a local reflectivity distribution having a two-fold or three-fold or four-fold or six-fold azimuthal symmetry.

The structured electrode 1060 in FIG. 10C has a multiplicity of electrode segments 1060A, 1060B which are electrically insulated from one another and which, with a small mutual distance between them, cover the circular area of the mirror element. Instead of the chequered arrangement of square electrode segments, by way of example it is also possible to provide other polygonal shapes, for example triangles or hexagons. The counterelectrode (not shown) on the other side of the active layer is continuous, that is to say not subdivided into segments. Insulating regions 1064 composed of electrically insulating material and extending in different directions are arranged between the respective square electrode segments. Those electrode segments which adjoin the circular outer edge of the electrode arrangement can be directly contact-connected laterally from outside via corresponding first contact points KP1. The inner electrode segments without connection to the outer side of the structured electrode layer are contact-connected via narrow lines which run in an electrically insulated manner on both sides within the insulating regions 1064 to the electrode segments with which contact is respectively to be made and to second contact points KP2. It is thereby possible to put each electrode segment at a specific potential relative to the counterelectrode (not shown) separately and independently of other electrode segments and thereby to set the layer thickness of the active layer into the associated layer range.

EUV mirror arrangements which, with the aid of piezoelectrically active layers, enable a spatially resolving setting of the reflectivity profile over the total mirror surface of the mirror arrangement and/or over the surface of an individual mirror element can be used for various tasks. Possible uses in the context of the illumination system for an EUV microlithography projection exposure apparatus are presented hereinafter.

Figure 11:
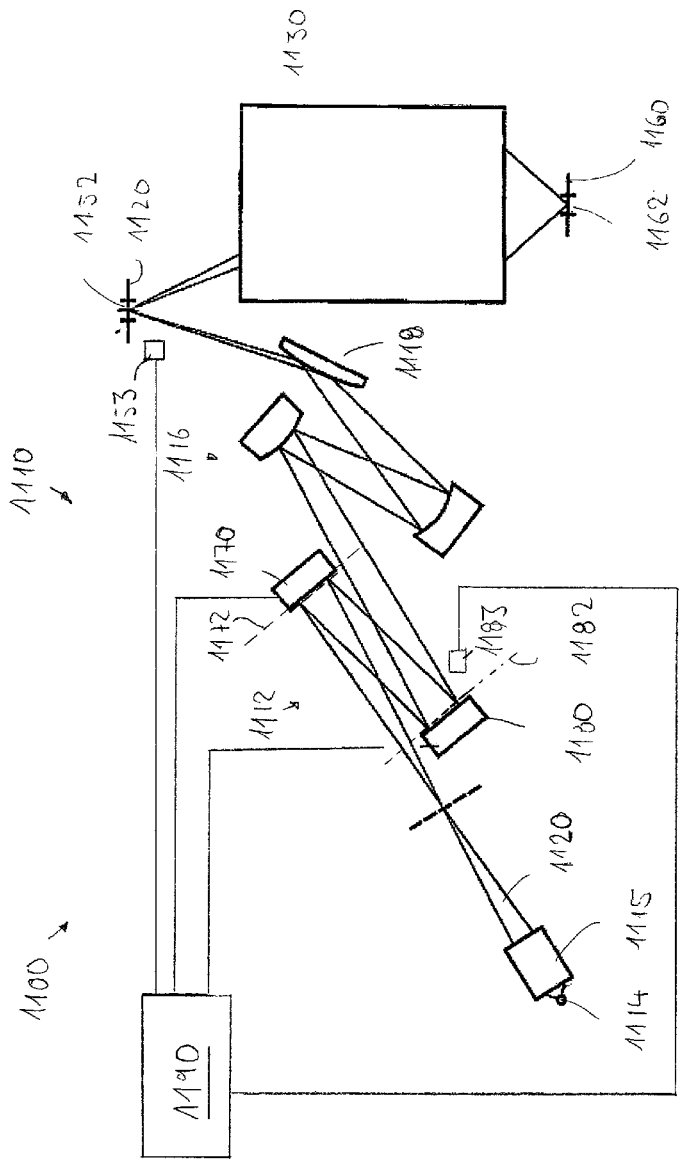
FIG. 11 shows optical components of an EUV microlithography projection exposure apparatus with embodiments of EUV mirror arrangements which are used as a field facet mirror and as a pupil facet mirror, respectively.

FIG. 11 shows optical components of an EUV microlithography projection exposure apparatus 1100 for exposing a radiation-sensitive substrate arranged in the region of an image surface 1160 of a projection lens 1130 with at least one image of a pattern of a reflective patterning device or mask arranged in the region of an object surface 1120 of the projection lens.

The apparatus is operated with radiation from a primary radiation source 1114. An illumination system 1110 serves for receiving the radiation from the primary radiation source and for shaping illumination radiation directed onto the pattern. The projection lens 1130 serves for imaging the structure of the pattern onto a light-sensitive substrate.

The primary radiation source 1114 can be, inter alia, a laser plasma source or a gas discharge source or a synchrotron-based radiation source. Such radiation sources generate a radiation 520 in the EUV range, in particular having wavelengths of between 5 nm and 30 nm. In order that the illumination system and the projection lens can operate in this wavelength range, they are constructed with components that are reflective to EUV radiation.

The radiation 1120 emerging from the radiation source 1114 is collected by means of a collector 1115 and directed into the illumination system 1110. In this case, the radiation passes through an intermediate focal plane 1122, in which devices for separating undesired radiation portions can be provided. The illumination system comprises a mixing unit 1112, a telescope optical unit 1116 and a field shaping mirror 1118. The illumination system shapes the radiation and thus illuminates an illumination field situated in the object plane 1150 of the projection lens 1130 or in the vicinity thereof. In this case, the form and size of the illumination field determine the form and size of the effectively used object field in the object plane 1150.

A reflective reticle or some other reflective patterning device is arranged in the object plane 1150 during operation of the apparatus. The projection lens in this case has six mirrors and images the pattern of the patterning device into the image plane, in which a substrate to be exposed, e.g. a semiconductor wafer, is arranged.

The mixing unit 1112 substantially consists of two facet mirrors 1170, 1180. The first facet mirror 1170 is arranged in a plane 1172 of the illumination system that is optically conjugate with respect to the object plane 1150. It is therefore also designated as a field facet mirror. The second facet mirror 1180 is arranged in a pupil plane 1182 of the illumination system that is optically conjugate with respect to a pupil plane of the projection lens. It is therefore also designated as a pupil facet mirror.

With the aid of the pupil facet mirror 1180 and the imaging optical assembly which is disposed downstream in the beam path and which comprises the telescope optical unit 1116 and the grazing incidence field shaping mirror 1118, the individual mirroring facets (individual mirrors) of the first facet mirror 1170 are imaged into the object field 1152.

By means of the facets of the field facet mirror 1170, on the one hand, and of the pupil facet mirror 1180, on the other hand, the radiation beam coming from the radiation source is split into a plurality of illumination channels, wherein each illumination channel is assigned exactly one pair of facets comprising a field facet and a pupil facet. The following components guide the radiation of all the illumination channels to the object field 1152.

The spatial (local) illumination intensity distribution at the field facet mirror determines the local illumination intensity distribution in the object field. The spatial (local) illumination intensity distribution at the pupil facet mirror 1180 determines the illumination angle intensity distribution in the object field.

EUV projection exposure apparatuses having a similar basic construction are known e.g. from WO 2009/100856 A1 or WO 2010/049020 A1, the disclosure of which is incorporated by reference in the content of this description.

In the embodiment shown, the channel-dependent transmissions and hence the energetic illumination angle distribution can be influenced by means of the reflectivities of the individual field and pupil facets. The spatial illumination intensity distribution in the object field can be influenced by location-dependent variation of the field facet reflectivities.

Each of the facet mirrors 1170, 1180 is an EUV mirror arrangement having a multiplicity of individual mirror elements. The mirroring front surfaces thereof are designated as element mirror surfaces and form the facets (mirror surfaces) of the facet mirror.

The field facet mirror 1170 and the pupil facet mirror 1180 are constructed in the manner of the EUV mirror arrangement 100 shown in FIG. 1. Each of the mirror elements therefore has a multilayer arrangement, into which an individual piezoelectrically active layer situated between two electrode layers is arranged between a second layer group near the substrate and a first layer group near the surface. The electrode layers are electrically connected to a control device 1190, which is configured for applying electrical voltage selectively as necessary to the electrode pairs associated with the individual active layers, in order to vary the layer thickness. This can be done for each mirror element separately and independently of the other mirror elements, such that different local distributions of the layer thickness variation and thus different local reflectivity distributions can be set at the relevant facet mirror.

The possibility of precisely controlling the local reflectivity of the facet mirrors can be used for controlling the illumination intensity distribution by way of the pupil of the illumination system and in the illumination field. If, in one or more of the illumination channels, the reflectivity of an associated field facet and/or the reflectivity of an associated pupil facet are/is altered by electrical driving, then it is possible to alter the illumination intensity in said illumination channel in a targeted manner within a certain setting range. Since this is possible for a plurality and, if appropriate, all of the illumination channels independently of other illumination channels, it is possible to realize a controllable manipulator for the illumination intensity distribution by way of the pupil in order to provide in the illumination field exactly a desired intensity distribution in a manner dependent on the illumination angle.

The field facet mirror can also have mirror elements which are constructed with structured electrodes and thus enable a location-dependent setting of the reflectivity of each individual mirror element (cf. FIG. 10). Since, in this embodiment, it is possible to control the reflectivity of the field facet mirror 1170 within the individual facets in a location-independent manner, it is possible to approximate the local illumination intensity distribution in the illumination field 1152 that is optically conjugate with respect thereto to the desired illumination intensity distribution in a location-dependent manner. In this way, a desired value of the field uniformity can be set precisely.

In the image field, the images of the individual field facets are superimposed. The long side thereof runs parallel to the x-direction (cross-scan direction), while the short side runs parallel to the y-direction, which corresponds to the scanning direction in scanner systems. What is achieved by the inclination of the insulating sections 1044 (FIG. 10A) is that the projection thereof into the image plane runs neither parallel nor perpendicularly to the scanning direction, but rather obliquely with respect thereto. During the scanning process, an effect integrated over the scanning process in the y-direction arises in the image field, such that in the image field possible artefacts of the insulating sections practically do not appear.

A fully programmable "neutral filter" for intensity distributions in the pupil and field of the illumination system is thus realized. In this case, the lateral resolution of the controllable neutral filter is determined by the lateral extent of the mirror elements which are driveable separately from one another, or by the number thereof over the illuminated cross section.

In the embodiment, the illumination intensity distribution in the illumination field 1152 is monitored by a field uniformity sensor 1153 and the illumination intensity distribution in the pupil surface is monitored by means of a pupil intensity sensor 1183. In a departure from the schematic illustration, these sensors can be situated in the region of the image plane of the projection lens. They are connected to the control device 1190, which, on the basis of the sensor signals, controls the voltage between the electrode layers of the individual piezoelectrically active layers and thus the local reflectivity distribution of the facet mirrors. A great precision of the important illumination parameters in the pupil and field of the illumination system is permanently ensured by this control loop.

Further embodiments now explained in connection with FIGS. 12 and 13 utilize some properties provided by the specific layer structure of EUV multilayer mirrors including at least one active layer made of a piezoelectrically active layer material. Firstly, single layers or layer stacks in EUV multilayer arrangement typically exhibit significant electrical conductivity, the specific electric resistance often being in the range of about $3 \times 10^{-6}$ Ω×cm. Therefore, layers of the multilayer arrangement may be utilized as contact layers, as explained in some embodiments above. Secondly, activation of the piezoelectric active material is effected by an electric field so that it is not necessary to establish electrically conducting contact between electrodes and the Piezo electrically active material.

Figure 12:
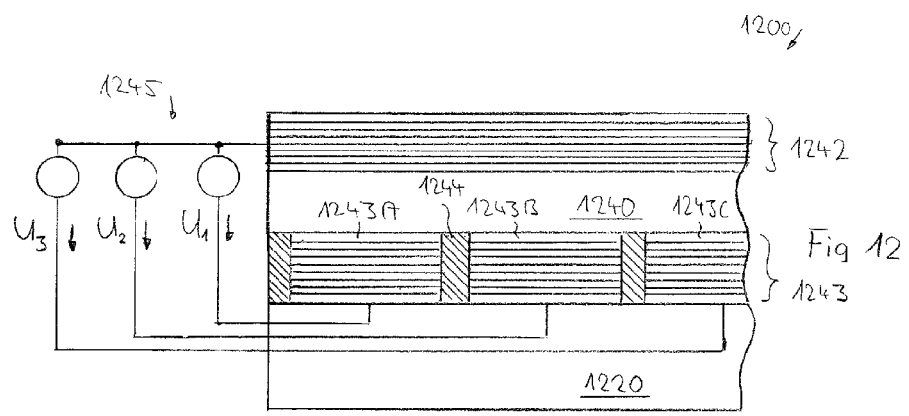
FIG. 12 shows an embodiment comprising a structured electrode comprising multiple multi-layered electrode segments on the substrate-side of an active layer and a continuous electrode extending across multiple mirror element on a radiation incidence side of the active layer.

The EUV mirror arrangement 1200 according to the embodiment shown in FIG. 12 comprises a substrate 1220, a second layer group 1243 formed on the substrate, an active layer 1240 made of a Piezo electrically active layer material formed on the second layer group 1243, and a first layer group 1242 formed on the active layer 1230 on the radiation incident side of the mirror arrangement. Each layer group may consist of multiple layer pairs with alternating high and low refractive index material, such as Mo/Si pairs or Ru/Si pairs. The second layer group 1243 is laterally subdivided into smaller portions 1243A, 1243B, 1243C, each smaller portion defining the lateral dimensions of a mirror element 1210, 1211, 1212 etc. Adjacent smaller portions of the layer groups are electrically separated from each other by interposed insulating sections 1244 formed between directly adjacent smaller portions of the second layer group. Each smaller portion forms a segment of a structured electrode.

In contrast to this, the layers of the first layer group 1242 extend continually (without interruption) over the entire useful cross section of the mirror arrangement. This embodiment utilizes the fact that the layer materials forming the layer pairs in the multilayer arrangement have sufficient electrical conductance so that the layer groups may be used as electrodes to provide a required electrical field across the active layer 1240. To this end, some or all individual layers of the first layer group 1242 on the radiation incidence side are electrically connected to one output of an electric voltage source 1245. Each of the smaller portions 1243A to 1243C is electrically connected through the substrate 1220 to a separate output of the voltage source 1245. In this circuitry the first layer group 1242 functions as a common electrode for each single mirror of the multiplicity of mirror elements in the mirror arrangement. Individual voltage values $U_1$, $U_2$ and/or $U_3$ may be set between the reference potential of the common electrode 1242 and the individual electrode segments 1243A, 1243B, 1243C on the opposite side of the active layer 1240.

Mirror arrangements such as shown in the embodiment 1200 may be manufactured in a manufacturing process as follows. In a first step, the layers of the second layer group 1243 may be formed on the substrate as continuous layers. In a second step, the layer arrangement may be structured by a suitable process, such as a lithographic process, to segment the layers laterally and to provide a space for the insulating material forming the insulating sections 1244 in any desired geometry so that smaller portions having the required shaped (for example quadratic, hexagonal, triangular etc.) may be formed. The insulating material may then be inserted in a suitable process. After that, all subsequent layers on the radiation incidence side may be formed by a suitable process as continuous layers extending over the entire useful area of the mirror arrangement. Any residual structural roughness present on the free surface after forming the structured second layer group 1243 may be evened out by the subsequent coating layers so that a large useful area with homogeneous properties may be obtained. It may be noted that use of a continuous layer group extending across the entire useful area (first layer group 1242) as a common electrode layer helps to reduce the number of electrical contacts required to connect the individual mirror elements electrically.

The layer structure of the mirror arrangement may include additional layers to those mentioned in connection with FIG. 12. For example, one or more insulating layer made of electrically insulating material may be formed between the electrode layer groups 1242, 1243 and the piezoelectrically active layer 1240 if required.

In a variant of the embodiment shown in FIG. 8 above, each of the pairs of electrode layers sandwiching an interposed active layer is connected to the same DC voltage source 845, thereby allowing adjusting the individual thicknesses of the active layers synchronously by the same relative amounts. A similar result may be achieved by using a common reference electrode providing a common reference potential, similar to the common first electrode formed by the first layer group 1242 in FIG. 12. In such arrangement, the active layers are electrically connected in series. The arrangement works properly if the field intensity of the electrical field is sufficiently strong across all Piezo electric layers.

Figure 13:
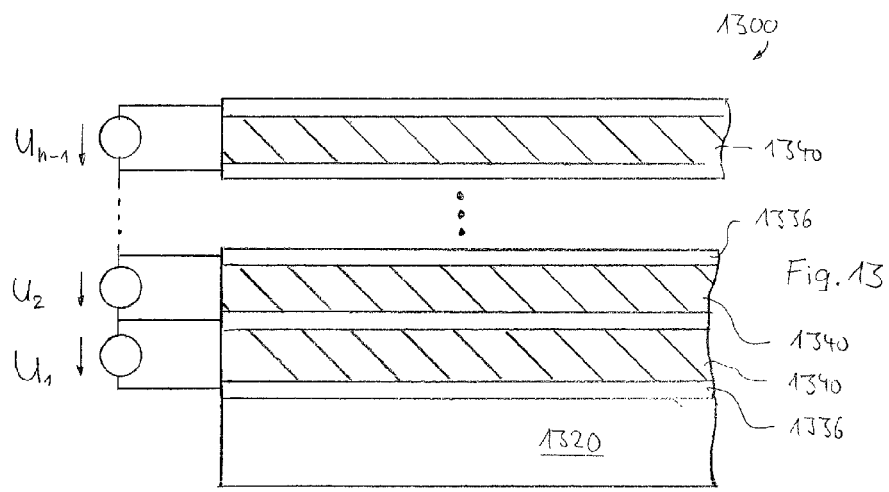
FIG. 13 shows an embodiment comprising multiple active layers which can be controlled individually.

The embodiment of an EUV mirror arrangement 1300 in FIG. 13 may be considered as a variant of the embodiment shown in FIG. 8. In the layer structure formed on substrate 1320, active layers 1340 made of piezoelectric material are alternatingly arranged with interposed relatively thin layers 1336 made of a material having a real part of the refractive index which is smaller than the real part of the refractive index of the piezoelectric material forming the thicker active layers 1340. The thinner layers 1336 are electrically conductive and serve as electrode layers influencing the respective active layers 1340 interposed between the pairs of electrode layers.

While the same voltage is applied between adjacent electron layers in the embodiment of FIG. 8, the variant of electrical connection shown in FIG. 13 allows adjusting the thickness of each of the active layers 1340 individually. To this end, the electrode layers 1336 enclosing each individual active layer 1340 are electrically connected to individual outputs of a voltage source so that the electrical field strength affecting each of the active layers 1340 may be set independent of the field strength acting on other active layers. As a result, the thickness of each of the active layers 1340 may be set individually and may be different from the thickness of other active layers in the layer stack. Depending on the individual voltages $U_1$, $U_2$, . . . , $U_{n-1}$ set between adjacent electrode layers, the layer structure may deviate from a strictly periodic sequence of layers so that the individual mirror elements may exhibit relatively high reflectance for a wider range of angles of incidence. In other words, a spectral broadband response of the EUV mirror arrangement may be obtained and a suitable compromise between maximum reflectivity and sufficient broadband response may be adjusted by setting the individual voltages of the electrode pairs separately.

In a variant of the embodiment shown in FIG. 9 the individual electrodes 942 formed on the light incidence side of the active layers 940 may be replaced by a single continuous top electrode formed by the third layer group 933 in a manner similar to the construction shown in FIG. 12. In other words, the individual electrodes 943 on the substrate side may be formed as shown and separated from the laterally adjacent electrodes by insulating sections similar to those shown in FIG. 12. A similar layer can also be obtained by replacing the individual multi layer electrodes 1243A to 1243C in FIG. 12 by a single electrode layer made of electrically conductive material.

A further embodiment not shown in detail here may be derived from the embodiment of FIG. 10A, which comprises a structured electrode 1042 on one side of the active layer 1040. As discussed above, the structured electrode 1042 is subdivided into a suitable number of individual electrode segments 1042A, 1042B which are laterally separated by insulating sections 1040 and which are electrically insulated from each other. The electrical insulation may be achieved by forming a continuous insulating layer directly on the structured electrode.

In a variant of the embodiment shown in FIG. 10A, the structured electrode is formed on the substrate side of the active layer, and connected to individual outputs of a voltage source similar to the manner shown in FIG. 12. A common reference electrode common to all individual mirror elements may be provided on the opposite side of the active layer in a manner similar to that shown by the common electrode 1242 in FIG. 12.

Some possible uses of EUV mirror arrangements in the illumination system of a microlithography projection exposure apparatus have been explained on the basis of the exemplary embodiments. Alternatively or additionally, provision can also be made for determining at least one mirror of the telescope optical unit 1116 of the illumination system and/or at least one mirror of the projection lens 1130 in accordance with an embodiment of an EUV mirror arrangement.

The total mirror surface of an EUV mirror arrangement can be flat in the manner of a plane mirror. It is also possible to design an EUV mirror arrangement in a convexly or concavely curved mirror surface. In the examples, the individual mirror surfaces are plane surfaces in each case. This is not mandatory, however. Individual or all of the individual mirror surfaces of the mirror elements can also be convexly or concavely curved.

In the exemplary embodiments, the relative orientations of the individual mirror surfaces of the EUV mirror arrangement are defined in each case, wherein the electrically induced change in layer thickness of the active layer merely leads to a raising or lowering of said mirror surface with respect to the substrate. It is additionally also possible for individual or all of the mirror elements of an EUV mirror arrangement to be tiltable relative to one another with the aid of independent actuators, in order to alter the illumination angle distribution of the reflected radiation in a targeted manner (cf. e.g. WO 2009/100856 A1).

The shape of the individual mirror elements can be adapted to the desired application. If, by way of example, an EUV mirror arrangement is intended to be used as a field facet mirror, the individual mirror surfaces can be rectangular with a predeterminable aspect ratio or else arcuately curved. In the case of EUV mirror arrangements which are intended to be used as a pupil facet mirror, round cross sections of the individual mirror elements can also be useful besides polygonal cross sections.

The layer construction of the multilayer arrangement in the region of the successive layer pairs can be adapted to the application striven for. If high maximum reflectivities are required for a relatively small angle-of-incidence range, then a fully periodic sequence of layer pairs can be advantageous. If, by contrast, a broadband configuration in the angle space and/or a spectral broadband configuration are/is desired, layer pairs with different periods can also be combined (cf. e.g. DE 101 55 711 B4 or WO 2010/118928 A1). In order to reduce the dependence of the reflectivity on the angle of incidence, the layer arrangement can, in principle, also be constructed in the manner disclosed in U.S. Pat. No. 7,382, 527 B2. In particular, different material pairings can be provided for the layer pairs of a multilayer arrangement.

The described layer constructions of the multilayer arrangements can, in principle, also be provided in the case of mirrors having only a single mirror element. It is thereby possible, e.g. by means of changing the layer period of a layer arrangement in an electrically induced manner, to effect an adaptation to a slightly different central wavelength and/or an adaptation to changed angles of incidence. Moreover, the global intensity or dose can be adapted.

When using structured layer electrodes (see e.g. FIG. 10), a location-dependent control of the reflectivity and/or phase of the radiation impinging on an individual mirror element is possible.

Embodiments of the invention can be used not just in optical systems for projection microlithography. By way of example, use in the field of X-ray microscopy is possible, particularly in the field of EUV mask metrology. By way of example, one or more mirror arrangements can be used in an Aerial Image Monitoring System (AIMS) or in an Actinic Patterned Mask Inspection System (APMI) or in an Actinic Blank Inspection System (ABI). Lenses for EUV AIMS systems are disclosed e.g. in the international publications WO 2011/012267 A1 and WO 2011/012266 A1. Applications in EUV system metrology, e.g. in an actinic system interferometer, are likewise conceivable. Applications in the field of EUV astronomy and for optical assemblies in synchrotron systems or FEL beam lines (FEL=Free Electron Laser) are furthermore conceivable.

The exemplary embodiments were configured for a central wavelength of 13.5 nm. Other exemplary embodiments can be optimized for other wavelengths (wavelength ranges), for example for a central wavelength of approximately 6.8 nm. In this case, in particular, it is also possible to use other layer materials for the alternate layers of the layer pairs, e.g. the combination La/$B_4C$. In the case of shorter central wavelengths it may be expedient to increase the numbers of layer pairs in layer groups in comparison with the examples described above.

The above description of various embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A mirror arrangement for extreme ultraviolet (EUV) radiation comprising a multiplicity of mirror elements which are arranged alongside one another and jointly form a mirror surface of the mirror arrangement, wherein each mirror element comprises:
   a substrate,
   a multilayer arrangement applied on the substrate and having a reflective effect with respect to the EUV radiation, said multilayer arrangement comprising:
      a multiplicity of layer pairs having alternate layers composed of a high refractive index layer material and a low refractive index layer material, and an active layer arranged between a radiation entrance surface and the substrate and consisting of a piezoelectrically active layer material, the layer thickness of which active layer alters by action of an electric field; and for each active layer, a respective electrode arrangement configured to generate an electric field acting on the active layer, wherein the multilayer arrangement has a first layer group arranged between the radiation entrance surface and the active layer and having a first number N1 of layer pairs, and a second layer group arranged between the active layer and the substrate and having a second number N2 of layer pairs, wherein the numbers N1 and N2 of layer pairs of the first layer group and of the second layer group are configured such that, for at least one angle of incidence of the radiation impinging on the radiation entrance surface, the first layer group transmits a portion of the incident radiation through the active layer to the second layer group and the radiation reflected by the multilayer arrangement contains a first portion reflected by the first layer group and a second portion reflected by the second layer group.

2. The EUV mirror arrangement according to claim 1, wherein the active layer, in the absence of an electric field, has a layer thickness configured such that for a reference angle of incidence of the incident radiation a reflectivity of the multilayer arrangement is altered by a maximum of 20% by applying an electric field.

3. The EUV mirror arrangement according to claim 1, wherein the piezoelectrically active layer material substantially consists of barium titanate ($BaTiO_3$).

4. The EUV mirror arrangement according to claim 1, wherein at least one of the following conditions holds true:

$10 < N1 < 30$ (1)

$15 < N2 < 50$ (2)

$30 < (N1+N2) < 70$ and $N1 > 10$ and $N2 > 10$ (3)

$N1 \leq N2$ (4)

$z \geq 2$ nm (5)

$z \leq 35$ nm (6)

$\Delta z \geq 0.1$ nm (7)

$0.15$ nm $\leq \Delta z \leq 2$ nm, (8)

where z is the layer thickness of the active layer and $\Delta z$ is a change in layer thickness produced by the generated electric field.

5. The EUV mirror arrangement according to claim 1, wherein the electrode arrangement has a first electrode layer and a second electrode layer, and the active layer is arranged between the electrode layers.

6. The EUV mirror arrangement according to claim 1, wherein the electrode arrangement, for driving the active layer has an electrode layer, wherein the electrode layer is a structured layer electrode and is subdivided into a plurality of electrode segments which lie alongside one another and are electrically insulated from one another, and wherein each of the electrode segments covers only a fraction of a total cross-sectional area of the mirror element.

7. The EUV mirror arrangement according to claim 6, wherein the electrode arrangement comprises a common electrode opposite to the structured layer electrode, the common electrode extending over at least a plurality of mirror elements.

8. The EUV mirror arrangement according to claim 7, wherein the common electrode is formed on a radiation incidence side of the active layer, opposite to the substrate side of the active layer, and wherein the common electrode arranged on the radiation incidence side comprises a plurality of single layers stacked on top of each other to form a multilayer.

9. The EUV mirror arrangement according to claim 6, wherein at least one of:

at least one electrode layer is a PLD layer applied by pulsed laser deposition (PLD), and an electrode layer consists of an electrically conductive ceramic material.

10. The EUV mirror arrangement according to claim 1, wherein the active layer is a PLD layer applied by pulsed laser deposition (PLD).

11. The EUV mirror arrangement according to claim 1, wherein the piezoelectrically active layer material is selected from the group consisting of: $Ba(Sr,Zr)TiO_3$, $Bi(Al,Fe)O_3$, $(Bi,Ga)O_3$, $(Bi,Sc)O_3$, CdS, (Li,Na, K) $(Nb,Ta)O_3$, $Pb(Cd, Co,Fe,In,Mg,Ni,Sc,Yb,Zn,Zr)$ $(Nb,W,Ta,Ti)O_3$, ZnO, ZnS or contains at least one material of this group in combination with at least one other material.

12. An optical system comprising at least one EUV mirror arrangement as claimed in claim 1.

13. The optical system according to claim 12, wherein the optical system is an illumination system or a projection lens of a micrography projection exposure apparatus.

14. The optical system according to claim 13, wherein the EUV mirror arrangement is arranged in a beam path of the illumination system between a light source and an illumination field to be illuminated in or near a field plane situated optically conjugate with respect to a plane of the illumination field.

15. The optical system according to claim 14, wherein, the layer thickness of the active layer is altered, for at least a plurality of the mirror elements of the mirror arrangement, in a location-dependent manner such that the reflectivity of a mirror element is set and varied in a location-dependent manner.

16. The optical system according to claim 12, wherein the EUV mirror arrangement is arranged in the region of a pupil plane of the illumination system, wherein the pupil plane is situated Fourier-transformed with respect to the plane of the illumination field.

17. A method for operating an optical system comprising at least one EUV mirror arrangement as claimed in claim 1, comprising varying a local reflectivity distribution over the mirror surface of the EUV mirror arrangement in a location-dependent manner by selectively driving at least individual ones of the active layers of the mirror elements.

18. The method according to claim 17, further comprising detuning the layer period by changing the layer thickness of the active layer.

19. The method according to claim 18, wherein the layer period is detuned for at least one of:

adapting the reflectivity to a central wavelength of the radiation from deviating from a desired value, and adapting the reflectivity to an altered angle-of-incidence distribution at the mirror arrangement.

20. A mirror arrangement for extreme ultraviolet (EUV) radiation comprising a multiplicity of mirror elements which are arranged alongside one another and jointly form a mirror surface of the mirror arrangement, wherein each mirror element comprises:

a substrate, a multilayer arrangement applied on the substrate and having a reflective effect with respect to the EUV radiation, said multilayer arrangement comprising:

a multiplicity of layer pairs having alternate layers composed of a high refractive index layer material and a low refractive index layer material, and an active layer arranged between a radiation entrance surface and the substrate and consisting of a piezo-electrically active layer material, the layer thickness of which active layer alters by action of an electric field; and for each active layer, a respective electrode arrangement configured to generate an electric field acting on the active layer, wherein the multilayer arrangement has a multiplicity of active layers composed of a piezoelectrically active layer material, wherein the active layers are respectively arranged alternatively with non-active layers to continuously vary a layer period within the multilayer arrangement.

21. The EUV mirror arrangement according to claim 20, wherein the active layer material consists predominantly of a ceramic material of the type (Li, Na, K)(Nb, Ti)$O_3$.

22. The EUV mirror arrangement according to claim 21, wherein the active layer material is selected from the group considting of potassium niobate (KNbO3), lithium niobate (LiNbO3), PbNb2O6 and sodium potassium niobate ($Na_{0.9}K_{0.1}NbO_3$).

23. The EUV mirror arrangement according to claim 20, wherein individual non-active layers formed by electrically conductive, non-piezoelectrically active layer material are connected to individual outputs of a voltage source, such that electric field strengths affecting the different active layers are set individually.

24. An optical system comprising at least one EUV mirror arrangement as claimed in claim 20.

25. A method for operating an optical system comprising at least one EUV mirror arrangement as claimed in claim 20, comprising varying a local reflectivity distribution over the mirror surface of the EUV mirror arrangement in a location-dependent manner by selectively driving at least individual ones of the active layers of the mirror elements.

* * * * *